United States Patent [19]

Uemura et al.

[11] Patent Number: 5,705,831
[45] Date of Patent: Jan. 6, 1998

[54] SEMICONDUCTOR LIGHT-EMITTING DEVICE AND PRODUCTION METHOD THEREOF, AND CRYSTAL-GROWING METHOD SUITABLE FOR THE PRODUCTION METHOD

[75] Inventors: Nobuyuki Uemura, Takatsuki; Minoru Kubo, Nabari; Yoichi Sasai; Kazuhiro Ohkawa, both of Hirakata; Satoshi Kamiyama, Sanda; Takeshi Uenoyama, Kyoto, all of Japan

[73] Assignee: Matsushita Electric Industrial Co., Ltd., Kadoma, Japan

[21] Appl. No.: 415,540

[22] Filed: Apr. 3, 1995

[30] Foreign Application Priority Data

Apr. 7, 1994 [JP] Japan .................. 6-69487
Aug. 23, 1994 [JP] Japan .................. 6-198300

[51] Int. Cl.$^6$ ............ H01L 29/22; H01L 31/0256; H01L 31/0296; H01L 33/00
[52] U.S. Cl. ............................... 257/78; 257/94
[58] Field of Search ........................ 257/78, 94

[56] References Cited

U.S. PATENT DOCUMENTS 5,291,506 3/1994 Ahn ................................. 257/78

OTHER PUBLICATIONS

Okuyama et al; Journal of Crystal Growth, 117, pp. 139–143, 1192, "Epitaxial Growth of ZnMgSSE on GaAs Substrate by Molecular Beam Epitaxy."

Itoh et al, Jpn. J. Appl. Phys., vol. 32, pp. L 1530–L 1532, Oct. 1993 "491–nm ZnCeSe/ZnSe/ZnMgSSe SCH Laser Diode With a Low Operating Voltage".

Xie et al, Appl. Phys. Lett. 60(16), Apr. 1992, "Room Temperature Blue Light Emitting p–n Diodes from Zn(S, Se)–Based Multiple Quantum Well Structures."

Xie et al, Appl. Phys. Lett 60(4), pp. 463–465 Jan. 1992, "Blue/Green pn Junction Electroluminescence from ZnSe–Based Multiple Quantum–Well Structures."

Ohkawa et al, Japanese Journal of Applied Physics, vol. 30, No. 2A, pp. L 152–L 155, Feb. 1991, "Characteristics of p–type ZnSe Layers . . . "

Ohkawa et al, J. Appl. Phys. 62(8), Oct. 1987, "Characateristics of Cl–Doped ZnSe Layers Grown by Molecular–Beam Epitaxy."

*Primary Examiner*—Stephen Meier
*Attorney, Agent, or Firm*—Renner, Otto, Boisselle & Sklar

[57] ABSTRACT

According to one aspect of the invention, a crystal-growing method for forming a II-VI single crystalline semiconductor expressed by $Zn_{1-x}Cd_xSe$ (where $0<x<0.35$) is provided. The crystal-growing method includes a step of epitaxially growing the II-VI single crystalline semiconductor on a substrate by: supplying a II element Zn onto the substrate by using a molecular beam from a ZnSe compound source and a molecular beam from a Zn elemental source; supplying a II element Cd onto the substrate by using a molecular beam from a CdSe compound source; and supplying a VI element Se onto the substrate by using a molecular beam from a ZnSe compound source.

10 Claims, 18 Drawing Sheets

△ : In the case of supplying Cd from an elemental Cd

◇ : In the case of supplying Cd from a polycrystalline CdSe

△ : In the case of supplying Mg from an elemental Mg

◇ : In the case of supplying Mg from polycrystalline MgSe

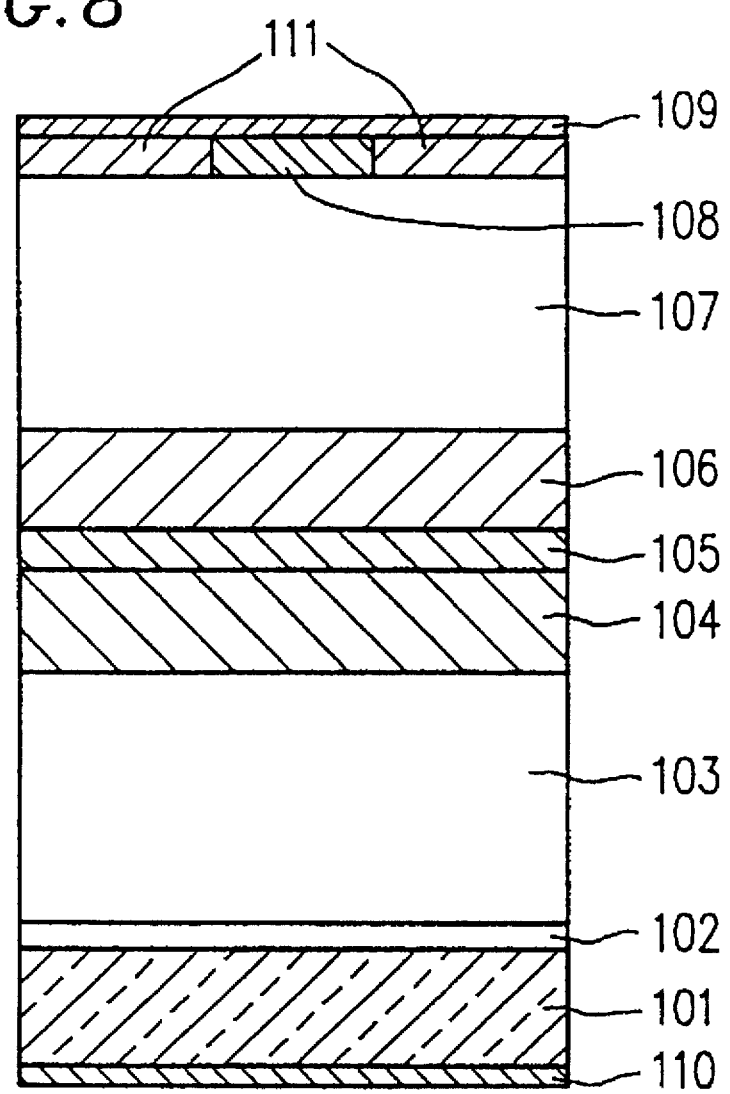

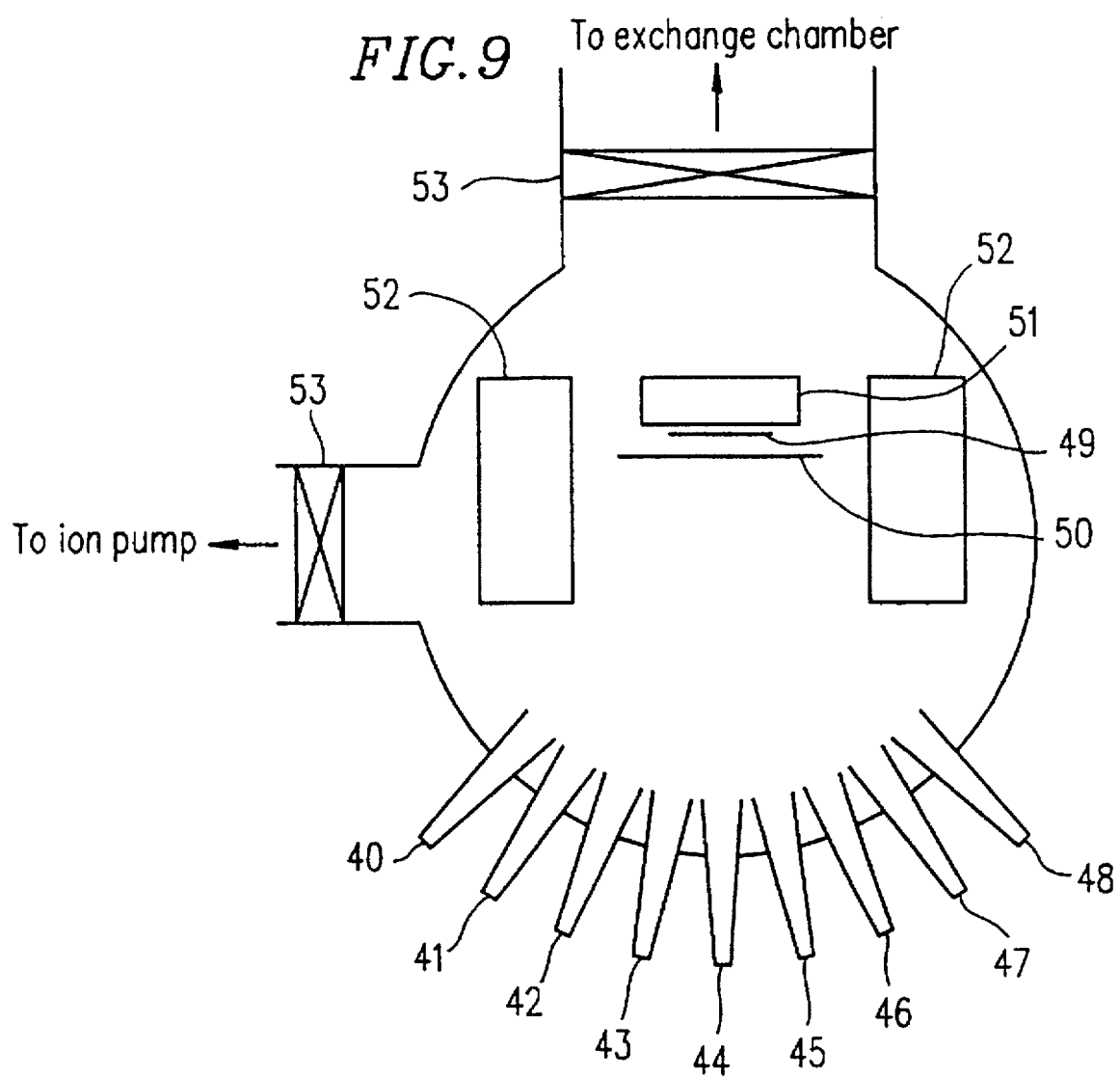

SEMICONDUCTOR LIGHT-EMITTING DEVICE AND PRODUCTION METHOD THEREOF, AND CRYSTAL-GROWING METHOD SUITABLE FOR THE PRODUCTION METHOD

BACKGROUND OF THE INVENTION

1. Field of the Invention

The present invention generally relates to a semiconductor light-emitting device and a method for producing the same, and it also relates to a crystal-growing method suitable for the production method. Particularly, this invention relates to a method for producing a II-VI compound semiconductor layer using a molecular beam epitaxial growth, and light-emitting device including such a semiconductor layer.

2. Description of the Related Art

Conventional crystal-growing methods utilizing a molecular beam epitaxy (MBE) system may be classified roughly into two types of methods. One type is a crystal-growing method using an elemental source such as Zn and Se, and the other type method is a crystal-growing method using a polycrystalline compound source such as ZnSe. Both of these types of methods are briefly described below with reference to FIGS. 1 and 2.

FIG. 1 shows a crystal-growing system using elemental sources only. As shown in FIG. 1, the crystal-growing system includes: a Zn effusion cell (hereinafter, simply referred to as a Zn cell) 21; an Se effusion cell (in the same way, referred to as an Se cell) 22; a Cd (effusion) cell 23; and shutters 24 to 26 for the respective cells 21 to 23. A GaAs substrate 27 is held by a molybdenum block and a rotating substrate heater 29. The irradiation of the molecular beams onto the substrate 27 is controlled by a main shutter 28. This growth chamber is sealed by closing a gate valve 30 so that the pressure level inside the chamber is maintained under an ultrahigh vacuum on the order of $10^{-10}$ Torr by using an ion pump and liquid nitrogen shrouds 31.

Under the above-mentioned construction, a ZnSe crystal is spitaxially grown on the substrate 27 by using a Zn molecular beam from the Zn cell 21 and an Se molecular beam from the Se cell 22.

FIG. 2 shows a crystal-growing system using polycrystalline compound sources only. As shown in FIG. 2, the crystal-growing system includes: a ZnSe cell 32; a CdSe cell 33; shutters 34 and 35 for the respective cells 32 and 33; a GaAs substrate 36; a main shutter 37; a molybdenum block and a rotating substrate heater 38; and liquid nitrogen shrouds 39. That is to say, the construction of this crystal-growing system is basically the same as that of the system using elemental sources only, which is shown in FIG. 1.

Under the above-mentioned construction, a ZnSe crystal is epitaxially grown on the substrate 36 by using a ZnSe molecular beam obtained from the ZnSe cell 32.

When using a conventional crystal-growing method using elemental sources, however, if the intensities of the respective molecular beams are varied, then the amounts of the respective materials grown on the surface of the substrate are also considerably varied. As a result, the Composition ratios of the mixed crystals are considerably varied when producing a ternary or quaternary mixed crystal.

In addition, an elemental cell must be used at a low temperature of 150° C. to 300° C., so that the thermal energy of the molecular beams becomes low. Accordingly, a problem occurs in that epitaxial growth is not realized unless the temperature of the substrate is 250° C. or more. Therefore, it has been difficult to form a superlattice structure with excellent reproductivity.

On the other hand, when using a method using compound sources such as ZnSe only, the compound sources are used at a high temperature of 700° C. or more, so that the thermal energy of the molecular beams of Zn and Se is high, and epitaxial growth may be realized even if the temperature of the substrate is low, e.g., 200° C. or less. However, since the beam-flux ratio of Se and Zn is always constant, the beam-flux ratio of Se and Zn cannot be adjusted to an optimal condition when producing a ZnSe based mixed crystal. Moreover, too much Se is absorbed on the surface of the substrate during crystal growth, and therefore it becomes difficult for a dopant such as nitrogen to enter an Se site as an acceptor.

SUMMARY OF THE INVENTION

According to the present invention, a crystal-growing method for forming a II-VI single crystalline semiconductor represented by $Zn_{1-x}Cd_xSe$ (where $0<x<0.35$) is provided. The crystal-growing method includes a step of spitaxially growing the II-VI single crystalline semiconductor on a substrate by supplying a II element Zn onto the substrate by using a molecular beam from a ZnSe compound source and a molecular beam from a Zn elemental source; supplying a II element Cd onto the substrate by using a molecular beam from a CdSe compound source; and supplying a VI element Se onto substrate by using a molecular beam from a ZnSe compound source.

According to another aspect of the present invention, a crystal-growing method for forming a II-VI single crystalline semiconductor represented by $Zn_{1-x}Mg_xS_ySe_{1-y}$ (where $0<x$ 0.5 and $0<y<0.5$) is provided. The crystal-growing method includes a step of epitaxially growing the II-VI single crystalline semiconductor on a substrate by: supplying a II element Zn onto the substrate by using a molecular beam from a ZnSe compound source and a molecular beam from a Zn elemental source; supplying a II element Mg onto the substrate by using a molecular beam from an MgSe compound source or an MgS compound source; supplying a VI element Se onto the substrate by using a molecular beam from an MgSe compound source or a ZnSe compound source; and supplying a VI element S onto the substrate by using a molecular beam from a ZnS compound source.

According to still another aspect of the present invention, a crystal-growing method for forming a II-VI single crystalline semiconductor expressed by $A_{1-x}B_xC_{1-y}D_y$ (where A and B are II elements, C and D are VI elements, $0<x<0.5$ and $0<y<0.5$) is provided. The crystal-growing method includes a step of epitaxially growing the II-VI single crystalline semiconductor on a substrate by: supplying a II element A onto the substrate by using a molecular beam from a compound source containing the II element A and a VI element and a molecular beam from an elemental source of the II element A; supplying a II element B onto the substrate by using a molecular beam from a compound source containing the II element B and a VI element; supplying a VI element C onto the substrate by using a molecular beam from a compound source containing the VI element C and a II element and a molecular beam from an elemental source of the VI element C; and supplying a VI element D onto the substrate by using a molecular beam from a compound source containing the VI element D and a III element.

In one embodiment, the compound source containing the II element A and a VI element includes a compound AC or a compound AD; the compound source containing the II element B and a VI element includes a compound BC or a compound BD; the compound source containing the VI element C and a II element includes the compound AC or the compound BC; and the compound source containing the VI element D and a II element includes the compound AD and the compound BD.

The semiconductor light-emitting device according to still another aspect of the invention includes a GaAs substrate and a II-VI compound semiconductor multi-layered structure formed on the GaAs substrate. The semiconductor multi-layered structure includes a ZnCdSSe active layer and a pair of ZnCdSSe guiding layers interposing the active layer; a mole fraction of Cd in the active layer is larger than a mole fraction of Cd in the guiding layer; and a mole fraction of S in the active layer is smaller than a mole fraction of S in the guiding layers.

In one embodiment, the multi-layered structure includes a pair of II-VI compound semiconductor cladding layers interposing the active layer and the pair of guiding layers; and the active layer, the pair of guiding layers and the pair of cladding layers forming a separate-confinement heterostructure.

In another embodiment, at least one of the pair of guiding layers is formed by a $(Zn_{1-x}Cd_xSe)_m (ZnS_ySe_{1-y})_n$ superlattice; and the active layer is formed by multiple layers of $Zn_{1-x}Cd_xSe$ forming the superlattice or $Zn_{1-x}Cd_xSe$ and $Zn_{1-u}Cd_uS_vSe_{1-v}$ (where $0<u<1$, $0<v<1$, $x<u$, and $y<v$).

In still another embodiment, at least one of the pair of guiding layers is formed by a $(ZnSe)_m (CdSe)_n (ZnS)_l$ (where m, n and l are integers) superlattice.

In still another embodiment, at least one of the pair of guiding layers is formed by a $(Zn_{1-a}Cd_aS_bSe_{1-b})_m (Zn_{1-c}Cd_cS_dSe_{1-d})_n$ superlattice (where $0\leq c\leq 1$, $0\leq d\leq 1$, $(am+bn)/(m+n)<x,y<(cm+dn)/(m+n)$, and m and n are integers).

In still another embodiment, the active layer is formed by a $(Zn_{1-x}Cd_xS_ySe_{1-y})_m (Zn_{1-z}Cd_zS_tSe_{1-t})_n$ (where $0\leq x\leq 1$, $0\leq y\leq 1$, $0\leq z\leq 1$, $0\leq t\leq 1$, $a<(xm+yn)/(m+n),(zm+tn)/(m+n)<b$, and m and n are integers).

In still another embodiment, the active layer is formed by a $(Zn_{1-a}Cd_aS_bSe_{1-b})_m (Zn_{1-c}Cd_cS_dSe_{1-d})_n$ superlattice; and at least one of the pair of the guiding layers is formed by a $(Zn_{1-x}Cd_xS_ySe_{1-y})_k (Zn_{1-z}Cd_zS_tSe_{1-t})_l$ (where m, n, k and l are integers, $0\leq z\leq 1$, $0\leq t\leq 1$, $(xk+yl)/(k+l)<(am+n)/(m+n)$, and $(cm+dn)/(m+n)<(zk+tl)/(k+1))$.

According to still another aspect of the present invention, a method for producing a semiconductor light-emitting device including a GaAs substrate and a II-VI compound semiconductor multi-layered structure formed on the GaAs substrate is provided. The semiconductor multi-layered structure includes a ZnCdSSe active layer and a pair of ZnCdSSe guiding layers interposing the active layer; a mole fraction of Cd in the active layer is larger than a mole fraction of Cd in the guiding layer; and a mole fraction of S in the active layer is smaller than a mole fraction of S in the guiding layers. The method includes a molecular beam epitaxy growth process for forming the guiding layers or the active layer by using a single cell of an elemental Cd or a compound containing the elemental Cd as a source for Cd.

In one embodiment, the guiding layers and the active layer are formed while keeping a molecular beam intensity of the single cell at the same level during the molecular beam epitaxy growth process.

According to still another aspect of the present invention, a method for producing a semiconductor light-emitting device including a GaAs substrate and a II-VI compound semiconductor multi-layered structure formed on the GaAs substrate is provided. The semiconductor multi-layered structure includes a ZnCdSSe active layer and a pair of ZnCdSSe guiding layers interposing the active layer; a mole fraction of Cd in the active layer is larger than a mole fraction of Cd in the guiding layers; and a mole fraction of S in the active layer is smaller than a mole fraction of S in the guiding layers. The method includes a molecular beam epitaxy growth process for forming the guiding layers or the active layer by using a single cell of an elemental S or a compound containing the elemental S as a source for S.

In one embodiment, the guiding layers and the active layer are formed while keeping a molecular beam intensity of the single cell at the same level during the molecular beam epitaxy growth process.

According to a crystal-growing method of the present invention, in the case of forming a II-VI single crystalline semiconductor expressed by $Zn_{1-x}Cd_xSe$ (where $0\leq x\leq 0.35$), molecular beams effused from the CdSe and ZnSe compound sources are used as the sources for supplying Cd and Se. Thus, the temperatures of these molecular beams are set at a high temperature, and the energy of the elements Cd and Se to be absorbed on the substrate becomes higher than that in the case of using essential sources. As a result, the above mentioned problems caused by using the molecular beams effused from the Cd and Se elemental sources may be eliminated.

On the other hand, not only the molecular beams effused from the compound sources but also the molecular beams effused from a Zn elemental source are employed as the sources for supplying Zn, thereby supplying a sufficient amount of Zn.

According to the present invention, the compound sources containing II-VI compounds such as CdSe and ZnSe are used as the sources for supplying Cd and Se in the above described manner. Therefore, even if the intensity of the molecular beams is varied on the surface of the substrate, the crystal growth is affected to a small degree.

Furthermore, according to the present invention, Zn, a main component of the semiconductor to be formed, is supplied from a ZnSe compound source and a Zn elemental source, so that the flux ratio of Zn and the other element(s) may be adjusted to an optimal condition. In other words, both advantages of the compound sources and the elemental sources may be obtained at the same time. As a result, the properties of a compound semiconductor of a ZnSe system may be reproduced more satisfactorily, thereby eliminating the irregularity from the properties of the obtained semiconductor devices, and improving the production yield.

In a semiconductor light-emitting device of the present invention, ZnCdSSe is used for an active layer and a guiding layer. In addition, the Cd mole fraction in the active layer is larger than the Cd mole fraction in the guiding layer, and the S mole fraction in the active layer is smaller than the S mole fraction in the guiding layer. As a result, a type I hetero junction may be formed between the active layer and the guiding layer, and the band offset of a valance band between the active layer and the guiding layer may be made larger than the band offset obtained in the case of using a $ZnS_{0.07}Se_{0.93}$ guiding layer. The larger the band offset of the valance band between the active layer and the guiding layer becomes, the more efficiently holes may be confined inside the active layer. Accordingly, a semiconductor light-emitting device having a low threshold current density, a long lifetime and exhibiting excellent properties may be provided.

Prior art problems such as the suspension of the growth during the production process of a semiconductor light-emitting device and the necessity for preparing a number of cells of the same material so as to correspond to the compositions of the respective layers may be solved by constituting the guiding layer with a superlattice $(Zn_{1-x}Cd_xSe)_m$ $(ZnS_ySe_{1-y})_n$ containing $Zn_{1-x}Cd_xSe$ constituting the active layer, or by constituting the guiding layer with a superlattice $(ZnSe)_m$ $(CdSe)_n$ $(ZnS)_l$ by the use of II-VI compound.

As a result, if either a single cell of an elemental Cd or a compound containing the elemental Cd, or a single cell of an elemental S or a compound containing the elemental S is used, then the guiding layer may be formed without changing the molecular beam intensity of the cell.

Thus, the invention described herein makes possible the advantages of (1) providing a crystal-growing method in which the variation of intensity of the molecular beam reaching the surface of the substrate affects the growth of a crystal to only a small degree, and (2) providing a semiconductor light-emitting device having improved characteristics and a method for producing the same.

These and other advantages of the present invention will become apparent to those skilled in the art upon reading and understanding the following detailed description with reference to the accompanying figures.

BRIEF DESCRIPTION OF THE DRAWINGS

FIG. 8 is a cross-sectional view of a semiconductor light-emitting device according to a third example of the present invention.

FIG. 9 is a cross-sectional view of a molecular beam epitaxy system used for forming the semiconductor light-emitting system shown in FIG. 8.

DESCRIPTION OF THE PREFERRED EMBODIMENTS

Hereinafter, the present invention will be described by way of illustrative examples with reference to the accompanying drawings.

Figure 1:
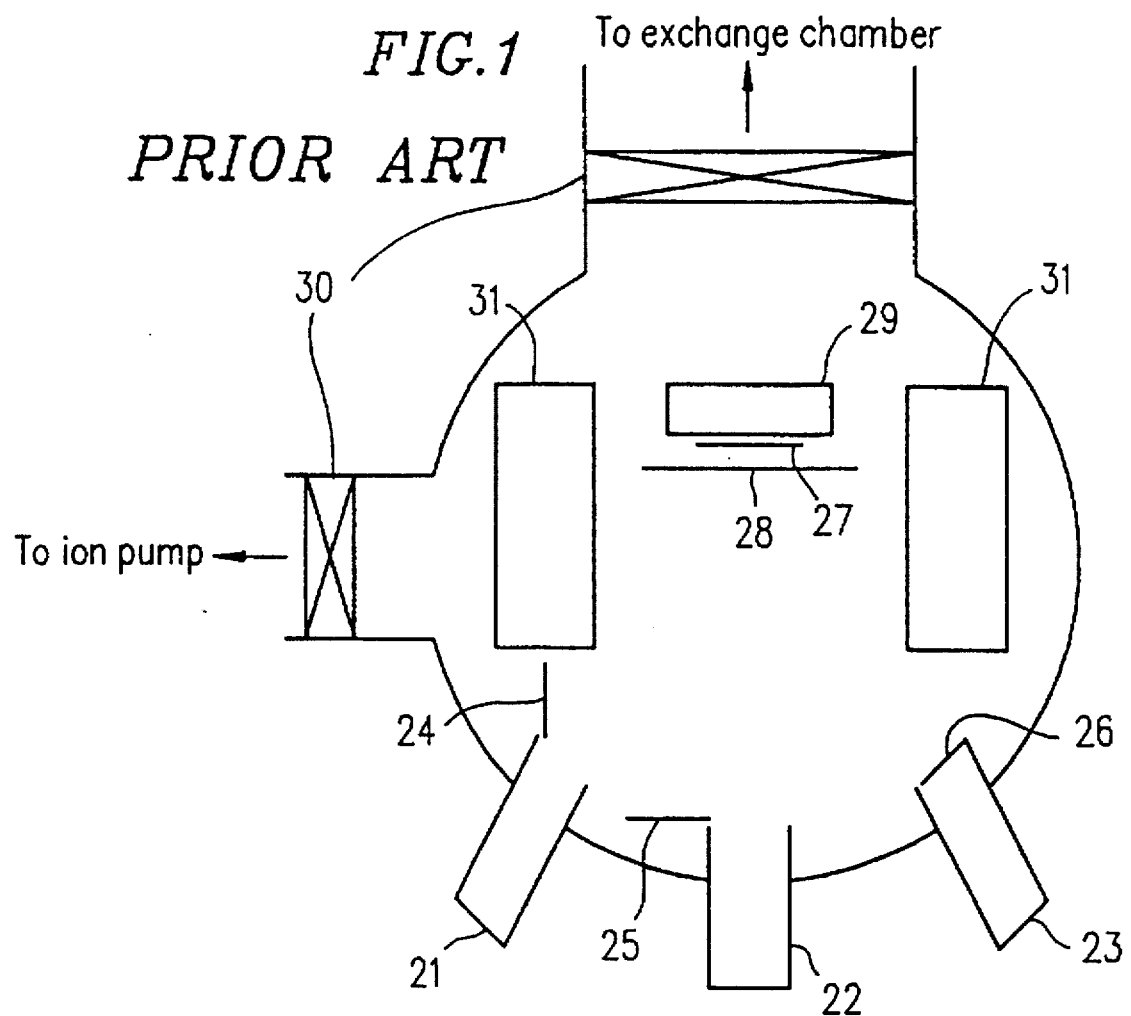
FIG. 1 is a cross-sectional view showing a first conventional crystal-growing system.
Figure 2:
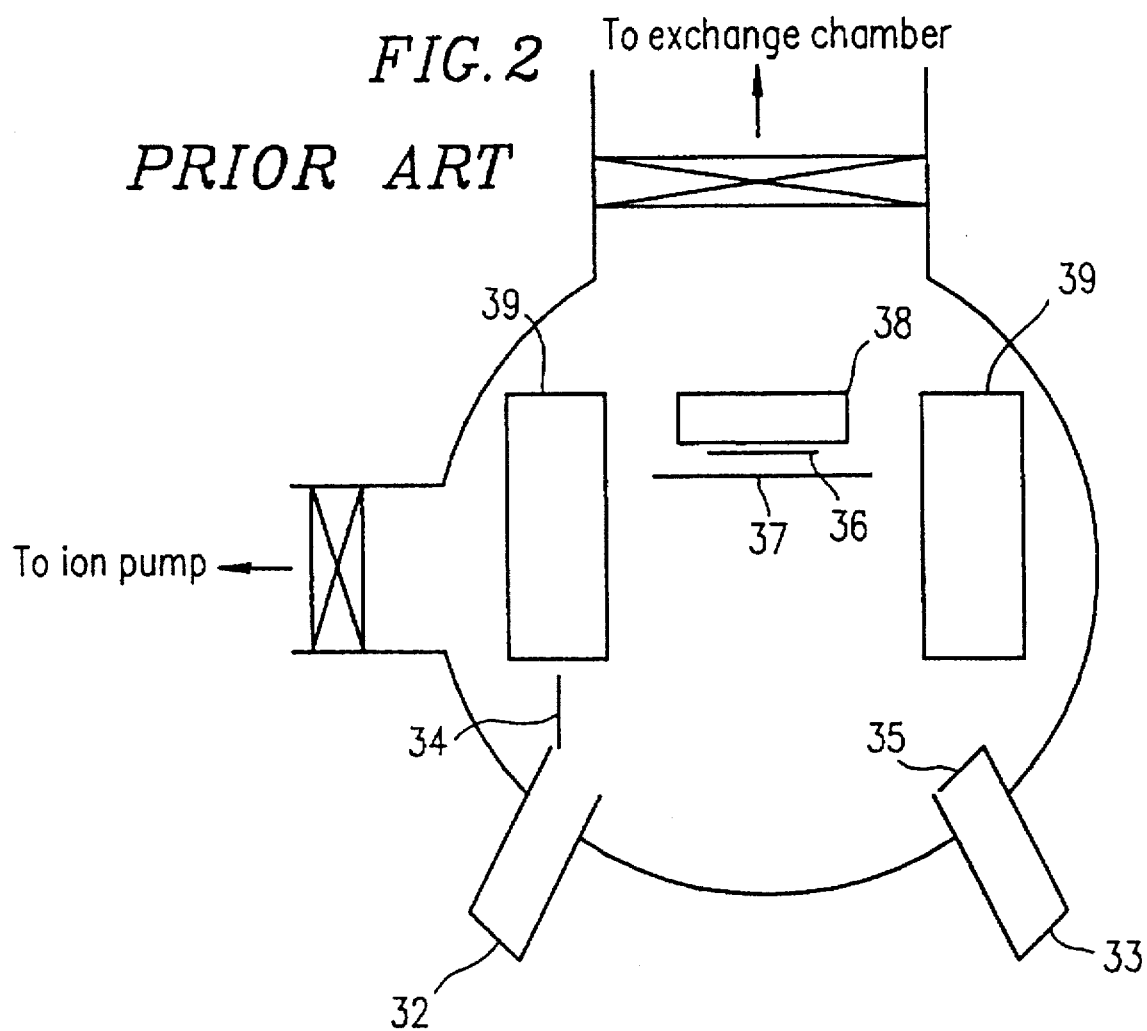
FIG. 2 is a cross-sectional view showing a second conventional crystal-growing system.
Figure 3:
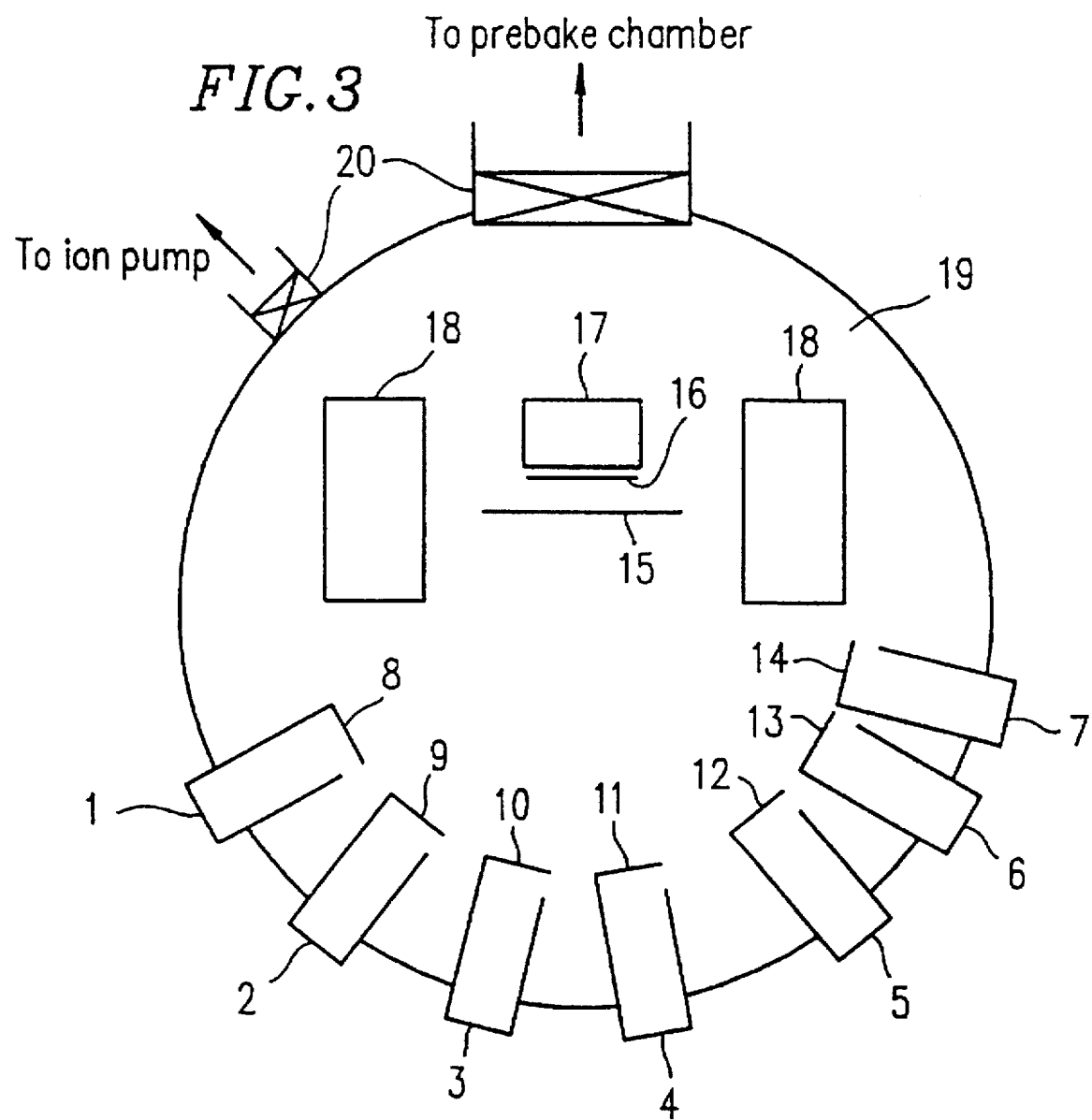
FIG. 3 is a cross-sectional view showing a crystal-growing system according to the present invention.

First, referring to FIG. 3, the construction of the system for a crystal-growing method of the present invention described below. The system shown in FIG. 3 is constructed essentially in the same manner as that for a conventional molecular beam epitaxy (MBE) system. The MBE system shown in FIG. 3 is characterized by the kinds of the effusion cells (hereinafter, referred to as cells) to be used for crystal growth.

The MBE system shown in FIG. 3 includes a growth chamber 19 for conducting an epitaxial growth method. The growth chamber 19 may be separated/coupled from/with an ion pump and the other chambers (not shown) by opening/closing a gate valve 20. The pressure level inside the growth chamber 19 during the crystal growth may be maintained in the order of $10^{-10}$ Torr by filling liquid nitrogen into the liquid nitrogen shroud 18 and by degassing with the ion pump.

The growth chamber 19 is provided with five cells for supplying constituting elements to a growing layer, i.e., a ZnSe cell 1; a Zn cell 2; a CdSe cell 3; a ZnS cell 4; and an MgSe cell 5. In addition, two more cells 6 and 7 are provided for the growth chamber 19 as the cells for supplying dopants. The cell 6 effuses radical nitrogen (radical $N_2$) used as a p type dopant, and the cell 7 effuses an n type dopant from a $ZnCl_2$.

The ZnSe cell 1, ZnS cell 4, MgSe cell 5, and $ZnCl_2$ cell 7 contain polycrystalline materials (compounds) in a chunk shape as the sources. The Zn cell 2 contains a stick shaped metal Zn (element) as the source. Shutters 8 to 14 are respectively disposed in front of the cells 1 to 7. The ON/OFF states of the effusion of the molecular beams from the respective cells 1 to 7 are controlled by opening/closing the respective shutters 8 to 14.

The temperatures of the cells 1 to 5 and 7 are kept at the setting temperatures by a temperature controller (not shown). The intensity (flux density) of the molecular beams effused from the respective cells may be controlled by varying the setting temperatures. With respect to the cell 6, if the output of an RF power supply and the flow rate of the $N_2$ gas are controlled, then the amount of $N_2$ in a radical state maybe adjusted.

A crystal-growth substrate 16 is placed on a molybdenum block 17 inside the growth chamber 19. The molybdenum block 17 has a rotating heater and rotates during crystal growth. The temperature of the substrate 16 is kept in the range of 150°–400° C. by a temperature controller of the rotating heater. Between the respective cells 1 to 7 and the substrate 16, a shutter 15 for controlling the irradiation of the molecular beams onto the surface of the substrate 16 is disposed.

Figure 4:
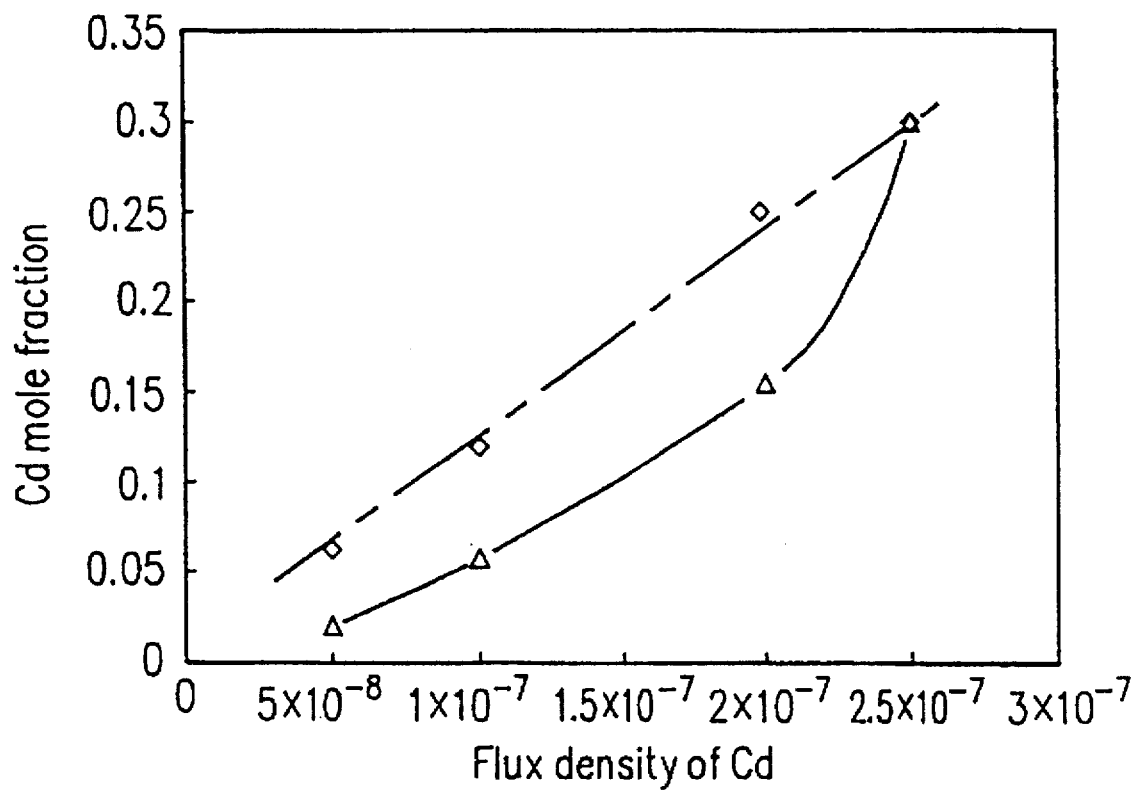
FIG. 4 is a graph showing the relationship between the molecular beam intensity of CdSe or Cd and the Cd mole fraction in the cases where a polycrystalline CdSe and an elemental Cd are used as a source for supplying Cd to a ZnCdSe mixed crystal.

When a ZnCdSe mixed crystal was produced by using the MBE system shown in FIG. 3, the relationship between the intensity of the molecular beam of CdSe and the Cd mole fraction of the ZnCdSe mixed crystal was obtained as shown in FIG. 4 while varying the temperature of the CdSe cell 3. For comparison, FIG. 4 also shows the relationship between the intensity of the molecular beam of Cd and the Cd mole fraction in the case of employing elemental Cd.

As is apparent from FIG. 4, the Cd mole fraction is varied in proportion to the intensity of the molecular beam in the case of employing a CdSe compound. Whereas, in the case of employing elemental Cd, the variation of the Cd mole fraction is not proportional to that of the intensity of the molecular beam of Cd.

These experimental results reveal that a method of the present invention in which a CdSe compound is used as a source of Cd makes it easier to control the Cd mole fraction in the ZnCdSe mixed crystal as compared to the case of employing a conventional method in which an elemental Cd is used as a source. The reasons thereof will be described in detail below.

Figure 5:
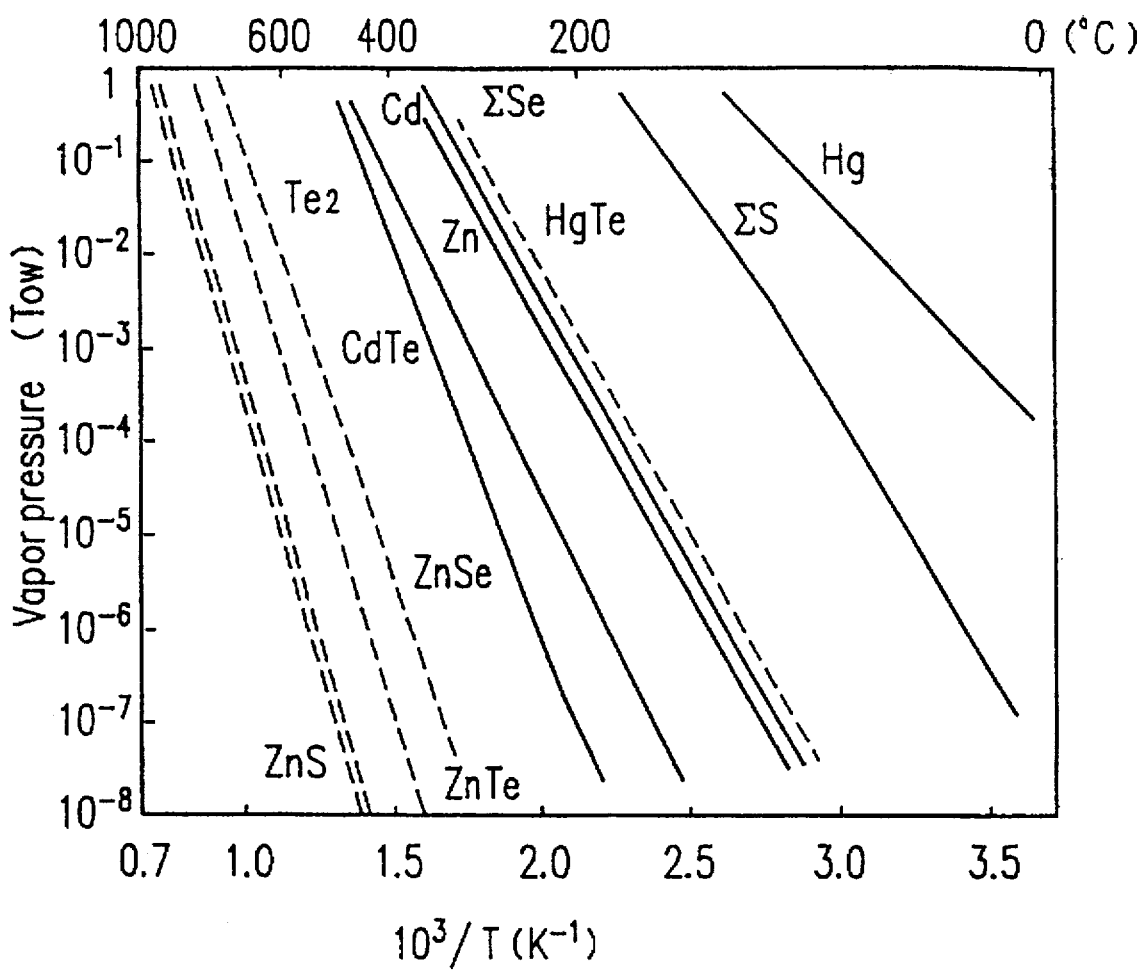
FIG. 5 is a graph showing the relationship between the vapor pressures of II-VI elements and the temperatures.
Figure 6:
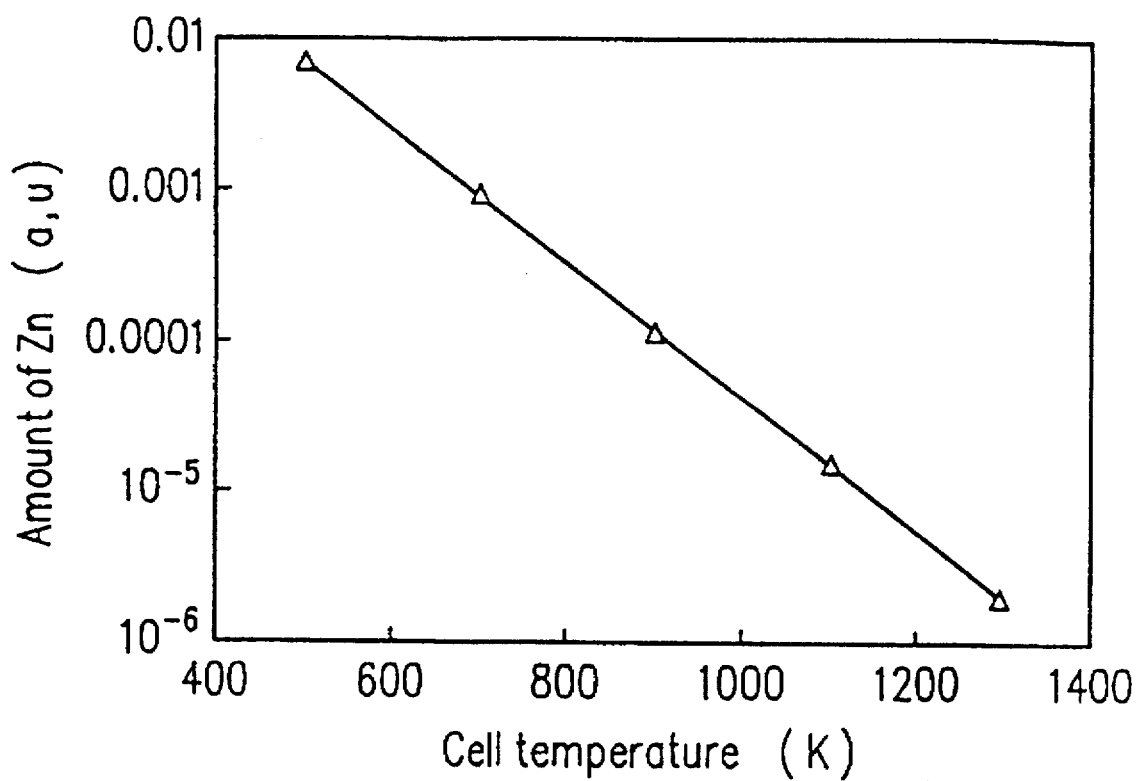
FIG. 6 is a graph showing the variation of the amount of Zn absorbed on the surface of a GaAs substrate in accordance with varying the temperature of a molecular beam of Zn in the case where a certain amount of molecular beam of Zn is incident on a ZnSe film grown on the GaAs substrate.

As shown in FIG. 5, the vapor pressure of an element such as Zn, Se and Cd is higher than that of a compound at a low temperature. Considering these properties of Such an element, the temperature of an effusion cell must be controlled so as to be a low temperature of 150°–300° C. in the case where a crystal is grown by using such an element for a cell. In growing a ZnSe-based compound semiconductor crystal, it is well known that the lower the temperature of the materials to be supplied to the surface of the substrate is, the longer the migration time of the supplied atoms on the surface of the substrate becomes. These properties support the result shown in FIG. 6. More specifically, as the temperature of the molecular beam becomes lower in accordance with the variation of the intensity of the molecular beam, the amount of the materials absorbed on the surface of the substrate is considerably varied. As a result, the composition ratio is also considerably varied in producing a ternary or a quaternary mixed crystal.

In the case where the temperature of the molecular beam is low, i.e. in the range of 150°–300° C., the variation of the molecular beam intensity during the crystal-growth varies the amount of Zn, Se and Cd on the surface of the substrate. As a result, the ratio of group-VI elements to group-II elements is also considerably varied. The variation of the molecular beam intensity is caused by the variations of the cell temperatures and those of the shapes of the source materials.

Next, the relationship between the temperature of the cells (or the temperature or the energy of the molecular beams) and the behavior of the molecules on the surface of the substrate is described below by employing Zn and Cd as exemplary elements.

In the case where the temperature of the molecular beams is low, the two elements Zn and Cd reaching the surface of the substrate receive thermal energy from the substrate, and migrate on the surface of the substrate. During the migration, some of the elements Zn and Cd evaporate again. Since the vapor pressure of Cd is higher than that of Zn, Cd is easier to evaporate from the surface of the substrate than Zn. As a result, the ratio of the amount of Cd to that of Zn on the surface of the substrate becomes smaller than the ratio of the molecular beam intensity of Cd to that of Zn. Accordingly, the mole fraction x of $Zn_{1-x}Cd_xSe$ becomes smaller than the ratio of Cd to Zn.

On the other hand, in the case where the temperature of the molecular beams is high, the two elements Zn and Cd reaching the surface of the substrate migrate with high thermal energy of their own on the surface of the substrate. In the course of the migration, a large amount of the high-energy elements Zn and Cd evaporates again. Owing to the evaporation of Cd and Zn, the ratio of the amount of Cd to that of Zn on the surface of the substrate is in proportion to the ratio of the molecular beam intensity of Cd to that of Zn. Accordingly, the mole fraction x of $Zn_{1-x}Cd_xSe$ varies in proportion to the ratio of the amount of Cd to that of Zn.

As is apparent from the description above, according to the crystal-growing method of the present invention, it becomes easier to control the Cd mole fraction in a ZnCdSe mixed crystal compared to employing a conventional crystal-growing method. Accordingly, the composition ratio and the film thickness of the ZnCdSe mixed crystal produced in accordance with the method of the invention may be made highly uniform as compared with the mixed crystal produced in accordance with a conventional method.

Figure 7:
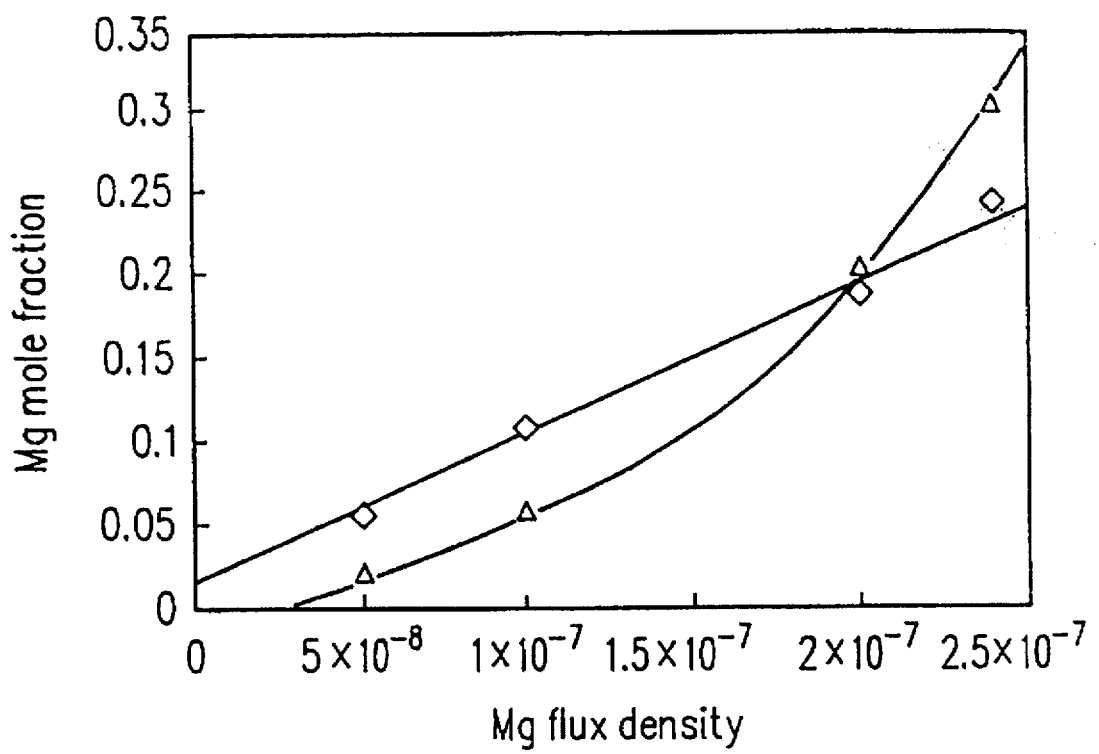
FIG. 7 is a graph showing the relationship between the molecular beam intensity of MgSe or Mg and the Mg mole fraction in the cases where a polycrystalline MgSe and an elemental Mg are used as a source for supplying Mg to a ZnMgSe mixed crystal.

The same effect is also true of the growth of a ZnMgSSe mixed crystal. FIG. 7 shows the relationship between varying the molecular beam intensity of MgSe in accordance with that of the temperature of an MgSe cell and the Mg mole fraction in the ZnMgSSe mixed crystal to be produced. For comparison, FIG. 7 also shows the relationship between the molecular beam intensity of Mg and the Mg mole fraction in the case of using elemental Mg.

As shown in FIG. 7, in the case of using an MgSe compound, the Mg mole fraction varies in proportion to the molecular beam intensity. On the other hand, in the case of using elemental Mg, Mg mole fraction is not proportional to that of the molecular beam intensity of Mg.

As described above, according to the crystal-growing method of the present invention, since the relationship between a molecular beam intensity and a mole fraction is linear, it is easier to control the composition ratio with high reproductivity.

Hereinafter, specific examples of the present invention are described with reference to the accompanying drawings.

EXAMPLE 1

Referring to FIG. 3, a crystal-growing method for a light-emitting diode having a double heterostructure is described below. The double heterostructure to be formed in this example includes: a p-$ZnS_{0.07}Se_{0.93}$ mixed crystal layer; an n-$ZnS_{0.07}Se_{0.93}$ mixed crystal layer; and an undoped $Zn_{0.7}Cd_{0.3}Se$ mixed crystal layer interposed between the two mixed crystal layers. Since Cd is a minority component of the undoped $Zn_{0.7}Cd_{0.3}Se$ mixed crystal, polycrystalline CdSe is employed as the source supplying Cd. Since Zn is a majority component, both polycrystalline ZnSe and elemental Zn are employed as the sources supplying Zn.

First, the temperatures of the respective cells are controlled so that the ratios of the intensities of the molecular beams may be 6:2:3 for ZnSe/Zn/CdSe and 13:1 for ZnSe/Zns, and so that the growth rate may be 3.2 Å. Specifically, the temperatures of the ZnSe cell 1, Zn cell 2, CdSe cell 3, end ZnS cell 4 are set at 700° C., 250° C., 550° C. and 750° C., respectively.

The temperature of the $ZnCl_2$ cell 7 is set at such a value so that a necessary doping level may be obtained. With respect to the $N_2$ radical cell 6, the output of the RF power supply and the flow rate of the $N_2$ gas are adjusted so that a necessary doping level may be obtained. For example, the output of the RF power supply is set at a value in the range of 100 to 200 W, and the flow rate of the $N_2$ gas is set at a value in the range of 0.01 to 0.1 sccm.

In this example, an n-GaAs substrate is employed as the substrate 16, and the temperature of the substrate 16 is set at 300° C. during the growth of layers.

After all of the above-described conditions of temperatures and the like are satisfied, an oxide film on the surface of the substrate 16 is removed. Then, the crystal-growth of ZnSe based semiconductor layers is initiated while controlling the opening/closing of the shutters. In this example, the shutter 8 for ZnSe, the shutter 9 for Zn, the shutter 14 for $ZnCl_2$, and the shutter 15 in front of the substrate-16 are first opened at the same time, thereby growing a ZnS layer. The shutter 11 for ZnS is opened 3 seconds later, whereby the crystal-growth of the n-$ZnS_{0.07}Se_{0.93}$ is initiated.

Two and a half hours later, the shutter 11 for ZnS and the shutter 14 for $ZnCl_2$ are closed, and the shutter 10 for CdSe is opened for 31 seconds instead, thereby growing the $Zn_{0.7}Cd_{0.3}Se$ mixed crystal (thickness: 100 Å).

Subsequently, the shutter 10 for CdSe is closed, the shutter 11 for ZnS is opened again, and at the same time the shutter 13 for the radical $N_2$cell is opened, thereby growing the p-$ZnS_{0.07}Se_{0.93}$ for one and a half hours.

Finally, the shutter 11 for ZnS is closed, the conditions for the $N_2$ radical cell 6 are replaced with the conditions for heavy doping, and then a contact layer for the p-ZnSe is grown for two minutes. The crystal-growth is finished by closing the shutter 15.

The photoluminescence, etc. of the light-emitting diode produced in accordance with the crystal-growing method of the present invention was evaluated. As the result of the current in section, the photoluminescence and other characteristics varied in the same way as a light-emitting diode produced in a conventional manner. A peak wavelength and the dispersion thereof was obtained based on a luminescence spectrum. A dispersion value of a light-emitting diode produced by a conventional method is (523±3) nm while the value of the light-emitting diode produced by the method of the present invention was (523±1) nm. That is to say, according to the present invention, the dispersion could be reduced by about a third. As a result, the lifetime Of the light-emitting diode produced by the method of the invention could be three times as long as that of a light-emitting diode produced by a conventional method. These results show that the composition ratio and the film thickness of the $Zn_{0.7}Cd_{0.3}Se$ mixed crystal produced by a method of the invention are highly uniform as compared with those of a mixed crystal produced bye conventional method, and that various characteristics of the mixed crystal have been much improved.

EXAMPLE 2

In this example, the crystal-growth of an undoped $Zn_{0.76}Mg_{0.24}S_{0.19}Se_{0.81}$ which has been lattice-matched with an undoped GaAs substrate is described.

First, the temperatures of the respective cells are controlled so that the ratio of the molecular beam intensities may be 56:10:24:19 for ZnSe/Zn/MgSe/ZnS and that the growth rate may be 800 nm/h. Specifically, the temperatures of the ZnSe cell 1, Zn cell 2, MgSe cell 5, end ZnS cell 4 are set at 730° C., 240° C., 690° C. and 800° C., respectively.

After all of the above-described conditions of temperatures and the like are satisfied, an oxide film on the surface of the substrate 16 is removed. Then, the crystal-growth of $Zn_{0.76}Mg_{0.24}S_{0.19}Se_{0.81}$ is initiated while controlling the opening/closing of the shutters and under a state where the temperature of the substrate is set at 300° C.

In this example, the shutter 8 for ZnSe, the shutter 9 for Zn, the shutter 14 for $ZnCl_2$, and the shutter 15 in front of the substrate 16 are first opened at the same time, thereby growing a ZnS layer. The shutter 11 for ZnS and the shutter 12 for MgSe are opened 3 seconds later, whereby the crystal-growth of the undoped $Zn_{0.76}Mg_{0.24}S_{0.19}Se_{0.81}$ is initiated.

Two and a half hours later, the crystal-growth is finished by closing the shutter 15.

The dispersion value of the film thickness of this undoped $Zn_{0.76}Mg_{0.24}S_{0.19}Se_{0.81}$ is the same as that of the undoped ZnSe grown in accordance with the method described in Example 1. An X-ray diffraction method was used for evaluating a lattice constant of the undoped $Zn_{0.76}Mg_{0.24}S_{0.19}Se_{0.81}$ and the dispersion values thereof. As a result, the value of the undoped $Zn_{0.76}Mg_{0.24}S_{0.19}Se_{0.81}$ produced by the method of the invention was (5.653±0.010) Å, while the value of the undoped $Zn_{0.76}Mg_{0.24}S_{0.19}Se_{0.81}$ produced by a conventional method was (5.653±0.025) Å.

That is to say, according to the method of the present invention, the dispersion value of the lattice constant of the undoped $Zn_{0.76}Mg_{0.24}S_{0.19}Se_{0.81}$ may be reduced by about a half.

On the other hand, a photoluminescence measurement was conducted for evaluating a band gap of the undoped $Zn_{0.76}Mg_{0.24}S_{0.19}Se_{0.81}$ the dispersion value thereof. As a result, the value of the undoped $Zn_{0.76}Mg_{0.24}S_{0.19}Se_{0.81}$ produced by the method of the invention was (3.0±0.07) eV, while the value of the undoped $Zn_{0.76}Mg_{0.24}S_{0.19}Se_{0.81}$ produced by a conventional method was (3.0±0.15) eV. That is to say, according to the method of the present invention, the dispersion value of the band gap of the undoped $Zn_{0.76}Mg_{0.24}S_{0.19}Se_{0.81}$ may be reduced by about a half. These results show that a larger number of ZnMgSSe mixed crystals, which have been lattice-matched with the GaAs substrate and are less defective than that obtained by a conventional method, may be obtained according to the method of the present invention.

The molecular beam intensities of the other components used for growing the ZnMgSSe mixed crystal are as follows: $5.6 \times 10^{-7}$ Torr for ZnSe; $1.0 \times 10^{-7}$ Torr for Zn; and $1.9 \times 10^{-7}$ Torr for ZnS. The temperature of the substrate is 300° C.

The result shown in FIG. 7 reveals the following characteristics.

In the case of employing an MgSe compound as a source supplying Mg, the Mg mole fraction in the grown mixed crystal is in proportion to the molecular beam intensity. For example, if the molecular beam intensity for MgSe is set at $1.0\times10^{-7}$ Torr, then the Mg mole fraction in the mixed crystal becomes 0.11, therefore the Mg mole fraction varies in proportion to the molecular beam intensity. On the other hand, in the case of employing elemental Mg as a source supplying Mg, the Mg mole fraction varies not in proportion to the molecular beam intensity, but non-linearly.

In producing a ZnMgSSe mixed crystal by employing elemental Mg in place of MgSe, if the molecular beam intensity for Mg is set at $2.4\times10^{-7}$ Torr, then the Mg mole fraction in the ZnMgSSe mixed crystal becomes 0.30. However, if the molecular beam intensity for Mg is set at $1.0\times10^{-7}$ Torr, then the Mg mole fraction in the ZnMgSSe mixed crystal becomes 0.06. In the case of employing elemental Mg, the Mg mole fraction varies considerably in accordance with the variation of the molecular beam intensity. These experimental results reveal that the method of this invention in which an MgSe compound is employed as the source for Mg makes it easier to control the Mg mole fraction in the ZnMgSSe mixed crystal as compared to a conventional method in which an elemental Mg is employed as the source.

As is apparent from the description above, according to the method of the present invention, a larger number of ZnMgSSe mixed crystals lattice-matched with a GaAs substrate may be obtained with satisfactory reproducibility so that the crystals may be less defective than those obtained by a conventional method, and it becomes easier to control the Mg mole fraction in the ZnMgSSe mixed crystal.

In addition, the same result may be attained if MgS is employed in place of MgSe.

According to the crystal-growing method of the present invention, II-VI type single crystalline semiconductors expressed by $Zn_{1-x}Cd_xSe$ (where $0 \leq x \leq 0.35$) or by $Zn_{1-x}Mg_xS_ySe_{1-y}$ (where $0 \leq x < 0.5$ and $0 \leq y < 0.5$) may be formed with satisfactory reproducibility while eliminating the irregularity from the resulting characteristics thereof. In addition, it becomes easier to obtain a desired composition ratio.

EXAMPLE 3

Referring to FIG. 8, a particular embodiment of a semiconductor light-emitting device is described in detail below. This semiconductor light-emitting device may be formed by using a molecular beam epitaxy (MBE) system shown in FIG. 9 in accordance with a molecular beam epitaxial growth method.

First, this MBE system is described with reference to FIG. 9. The MBE system includes a growth chamber for conducting an epitaxial growth method. The growth chamber may be separated/combined from/with an ion pump and the other chambers (not shown) by opening/closing a gate valve 53. The pressure level inside the growth chamber during the crystal growth may be maintained on the order of $10^{-10}$ Torr by filling liquid nitrogen into the liquid nitrogen shroud 52 and by degassing with the ion pump.

The growth chamber is provided with a plurality of cells for supplying constituent elements to a growing layer, i.e., a ZnSe cell 40; a Se Cell 41; a Cd cell 42 for a guiding layer; a Cd cell 43 for an active layer; a ZnS cell 44 for the guiding layer; a ZnS cell 45 for the active layer; and an Mg cell 46.

In addition, two more cells 47 and 48 are provided for the growth chamber as the cells for supplying dopants. The cell 47 effuses an n-type dopant from a $ZnCl_2$ cell 47, and the cell 48 effuses a radical $N_2$ used as a p-type dopant.

In front of the respective cells 40 to 48, shutters (not shown) are disposed. The ON/OFF states of the effusion of the molecular beams from the respective cells 40 to 48 are controlled by opening/closing the shutters.

The temperatures of the cells 40 to 47 are kept at the setting temperatures by a temperature controller. The intensity of the molecular beams effused from the respective cells may be controlled by varying the setting temperatures. With respect to the cell 48, if the output of an RF power supply and the flow rate of the $N_2$ gas are controlled, then the amount of $N_2$ in a radical states may be adjusted.

A crystal-growth substrate 49 is placed on a molybdenum block 51 inside the growth chamber. The molybdenum block 51 has a rotating heater and rotates during crystal growth. The temperature of the substrate 49 is kept in the range of 150°–400° C. by a temperature controller incorporated inside the rotating heater 51. Between the respective cells 40 to 48 and the substrate 49, a shutter 50 for controlling the amount of the molecular beams reaching the surface of the substrate 49 is disposed.

The pressure level inside the growth chamber is kept at an ultrahigh vacuum on the order of $10^{-10}$ Torr by using a liquid nitrogen shroud 52 and an ion pump. The temperatures of the respective cells are controlled so that a beam flux ratio of a molecular beam to be effused may correspond to a composition ratio of each layer to be grown.

Hereinafter, a method for producing a semiconductor light-emitting device shown in FIG. 8 by using a system shown in FIG. 9 is prescribed below. In this example, since the composition of a ZnCdSSe mixed crystal of the guiding layers is different from that of a ZnCdSSe mixed crystal of the active layer, a pair of cells for Cd and ZnS is used for each layer so that Cd and ZnS may be effused from the respective cells to the two kinds of layers by different amounts. The "ZnCdSSe" described herein expresses $Zn_{1-x}Cd_xS_ySe_{1-y}$ (where $0 < x \leq 1$ and $0 \leq y \leq 1$) in a simple form. Accordingly, ZnCdSSe must contain Cd, but need not contain S. For example, "$Zn_{0.8}Cd_{0.2}Se$" is also included in "ZnCdSSe".

First, an n-GaAs substrate 49 with (001) orientation is subjected to a surface treatment, and then held by a molybdenum block 51 having a rotating substrate heater. Next, the shutter 50 disposed in front of the n-GaAs substrate 49 whose temperature is set at a growth temperature is opened, and then a chlorine-doped n-ZnSe layer 102 having a carrier density of $2\times10^{18}$ cm$^{-3}$ is grown by using the zn cell 40, the Se cell 38, and the $ZnCl_2$ cell 47 so that the thickness of the layer 102 may be 100 Å. Immediately after the formation of the layer 102, a chlorine-doped n-$Zn_{0.83}Mg_{0.17}S_{0.2}Se_{0.8}$ cladding layer 103 having a carrier density of $2\times10^{18}$ cm$^{-3}$ and a film thickness of 1.0 μm is grown by using the ZnS cell 44 for the cladding layers, the Se cell 41, and the $ZnCl_2$ cell 47.

Subsequently, an undoped $Zn_{0.9}Cd_{0.1}S_{0.19}Se_{0.81}$ guiding layer 104 having a film thickness of 700 Å is formed by using the Zn cell 40, the Cd cell 42 for the guiding layers, the ZnS cell 45 for guiding layers, and the Se cell 41. The reason for setting the film thickness of the guiding layer at 700 Å are as follows: an optical confinement coefficient becomes maximum at the film thickness and, if the thickness, is set at the value, even an undoped guiding layer would hardly affect the resistance of the system.

Next, an undoped $Zn_{0.8}Cd_{0.2}Se$ active layer 105 having a film thickness of 60 Å is formed by using the Zn cell 40, the Cd cell 43 for an active layer, and the Se cell 41. On the active layer 105, an undoped $Zn_{0.9}Cd_{0.1}S_{0.19}Se_{0.81}$ guiding layer 106 having a film thickness of 700 Å is formed by using the Zn cell 40, the Cd cell 42, the ZnS cell 45 and the Se cell 41.

Then, a nitrogen-doped p-$Zn_{0.83}Mg_{0.17}S_{0.2}Se_{0.8}$ cladding layer 107 having a carrier density of $2\times10^{17}$ cm$^{-3}$ and a film thickness of 1.0 µm is formed by using the Zn cell 40, the Mg cell 46, the ZnS cell 44, the Se cell 41, and the active nitrogen cell 48.

Finally, a nitrogen-doped p-ZnSe contact layer 108 having a carrier density of $8\times10^{17}$ cm$^{-3}$ and a film thickness of 100 Å is grown by using the Zn cell 40, the Se cell 41, and the active nitrogen cell 48, thereby completing the double heterostructure consisting of the respective layers 102 to 108. The crystal growth is finished by closing the shutter 51.

After the substrate on which the above-described semiconductor multi-layered structure has been formed is taken out of the growth chamber, a mask layer having a stripe width of 3 µm is formed. Thereafter, an $SiO_2$ insulating film 111 having a thickness of 1000 Å is formed on the region of the substrate excluding the region where the mask layer is formed. A p-type electrode 109 is placed thereon, and an n-type electrode 110 is placed on the back surface of the GaAs substrate, thereby fabricating a light-emitting device substrate whose cross section is shown in FIG. 8. After that, the substrate is cleaved so that the cavity length may be 0.5 mm, and a Fabry-Perrot resonator is provided therein so as to complete a laser structure. Both end facets of the cleaved substrate are uncoated, and the reflectance thereof is 25%. An internal loss is 7.8 cm$^{-1}$, a cavity loss is 27.2 cm$^{-1}$, and a total loss is 35 cm$^{-1}$.

Figure 10A:
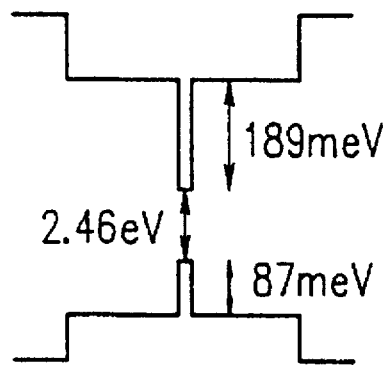
FIG. 10A is an energy-band diagram showing band offsets of a conduction band and a valence band between adjacent two layers in a conventional semiconductor light-emitting device.
Figure 10B:
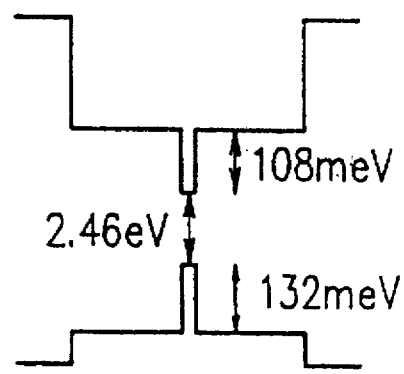
FIGS. 10B to 10D are energy-band diagrams showing respective band offsets of a conduction band and a valence band between the adjacent two layers of a semiconductor light-emitting device according to the third, fourth and fifth examples of the present invention.
Figure 10C:
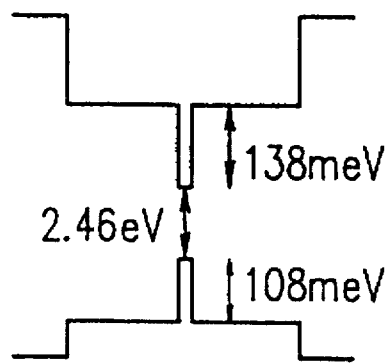

FIG. 10B shows the measurement result of the band offsets of the conduction band and the valence band between adjacent two layers based on a common anion rule and a common cation rule (see, for example, Kunio Ichino et al., "Design and Production of II-VI Semiconductor Heterostructure", J. Appl. Phys. Vol. 61, No. 2, 1992, p. 117). For comparison, FIG. 10A shows the band offset of a valence band between an active layer and a guiding layer in the case where a $ZnS_{0.07}Se_{0.93}$ guiding layer is employed as a guiding layer in accordance with a conventional method. In accordance with this conventional method, the band offset of the valence band between an active layer and a guiding layer becomes relatively small, i.e. 87 meV. On the other hand, the band offset of the valence band of the laser structure according to the invention is larger, i.e. 132 meV, than that of a conventional laser structure.

It has conventionally been considered sufficient for a band offset of the valence band to be about 87 meV. The inventors of the present application, however, have found some drawbacks therewith. Namely, if the band offset of the valence band is small, i.e., around 87 meV, then the holes cannot be confined in the active layer so efficiently. As a result, a threshold current density for the laser oscillator becomes large, i.e. i, in the range of 600 to 1100 Å/cm$^2$, and therefore the lifetime of the laser becomes disadvantageously short.

In addition, the mole fractions of Zn, S and Se are different from each other in the respective semiconductor layers during the growth of the layers in producing a semiconductor light-emitting device in a conventional manner. Therefore, according to a conventional method, the growth process steps must be suspended and conditions of the materials such as the temperature, the pressure and the like must be changed so as to correspond to the composition ratios of the respective layers. Otherwise, the same kind of material must be prepared in a plurality of cells so as to correspond to the respective layers.

According to the former method, the growth process must be suspended during a time period required for changing the temperature, pressure and the like of the materials in order to form the respective layers. The suspension of growth may deteriorate the interfaces between the respective layers, whereby the characteristics of the interfaces may be degraded. On the other hand, according to the latter method, the number of source materials to be used becomes larger; the construction of the crystal-growth system becomes very complicated; various kinds of maintenance such as the adjustment of the system and the exchange of the materials takes much time; and therefore the cost necessary for producing the light-emitting device becomes very high.

Figure 11A:
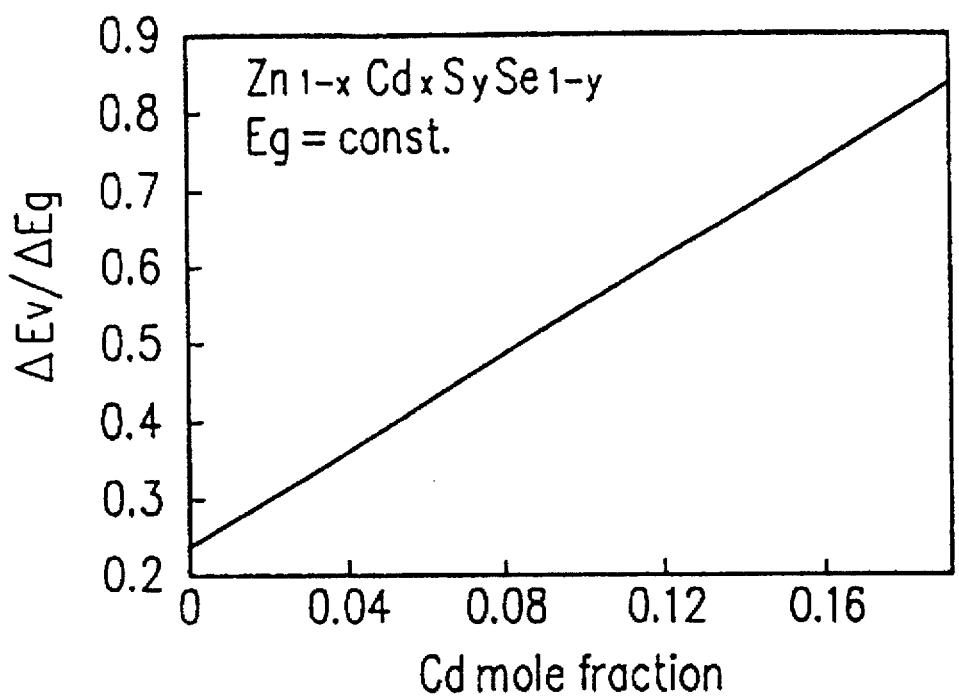
FIG. 11A is a graph showing the relationship between the varying Cd mole fraction and the ratio of the band offset of the valence band to the entire band offset of a ZnCdSSe guiding layer.
Figure 11B:
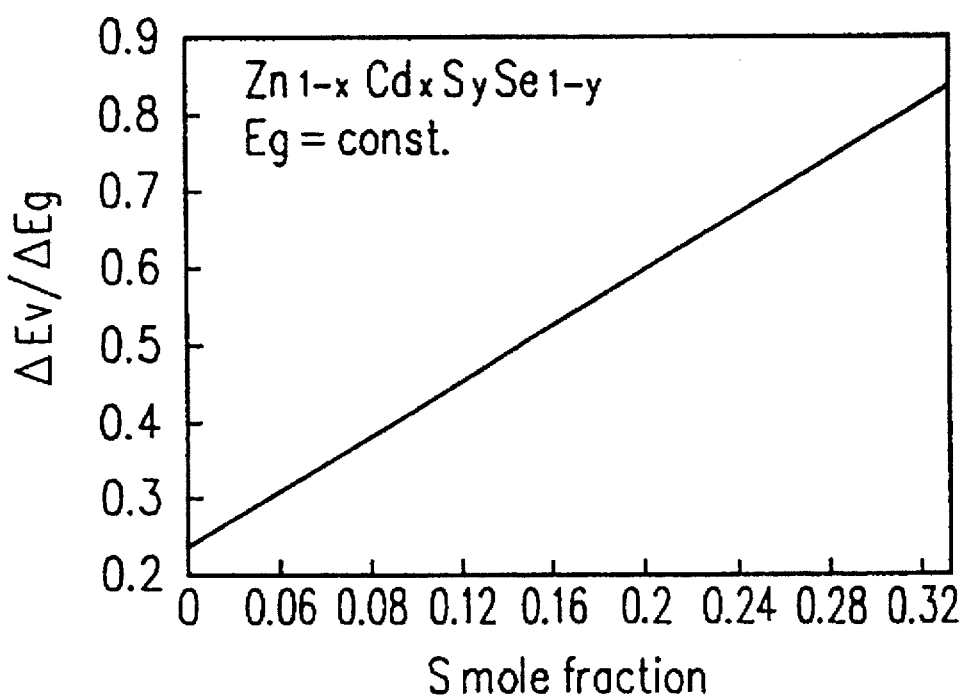
FIG. 11B is a graph showing the relationship between varying of the S mole fraction and the ratio of the band offset of the valence band to the entire band offset of a ZnCdSSe guiding layer.

FIG. 11A shows the relationship between the mole fraction of Cd in $Zn_{1-x}Cd_xS_ySe_{1-y}$ and the ratio $\Delta Ev/\Delta Eg$ of the band offset $\Delta Ev$ of the valence band to the entire band offset $\Delta Eg$. In the same way, FIG. 11B shows the relationship between the mole fraction of S in $Zn_{1-x}Cd_xS_ySe_{1-y}$ and the ratio $\Delta Ev/\Delta Eg$ of the band offset $\Delta Ev$ of the valence band to the entire band offset $\Delta Eg$. The band gap of $Zn_{1-x}Cd_xS_ySe_{1-y}$ is fixed at 2.72 eV. As is apparent from FIGS. 11A and 11B, as the mole fraction of Cd or S in the guiding layer becomes larger, the ratio $\Delta Ev/\Delta Eg$ also increases. That is to say, if the mole fraction of Cd or S in the guiding layer is increased, then the band offset of the valence band may be made larger.

Various characteristics of the light-emitting device produced in the above-mentioned manner are as follows. The band gaps of the $Zn_{0.83}Cd_{0.17}S_{0.2}Se_{0.8}$ cladding layer, the $Zn_{0.9}Cd_{0.1}S_{0.19}Se_{0.81}$ guiding layer, and the $Zn_{0.8}Cd_{0.2}Se$ active layer are 2.92 eV, 2.71 eV, and 2.46 eV, respectively. With respect to the crystallinity, both the $Zn_{0.83}Cd_{0.17}S_{0.2}Se_{0.8}$ cladding layer and the $Zn_{0.9}Cd_{0.1}S_{0.19}Se_{0.81}$ guiding layer are lattice-matched with the GaAs substrate, and the half-width (FWHM) of the rocking curve of an X-ray in the epitaxial layer is 40 sec. Accordingly, the light-emitting device of the invention exhibits almost the same crystallinity as that of a conventional light-emitting device using a $ZnS_{0.07}Se_{0.93}$ guiding layer.

Figure 12:
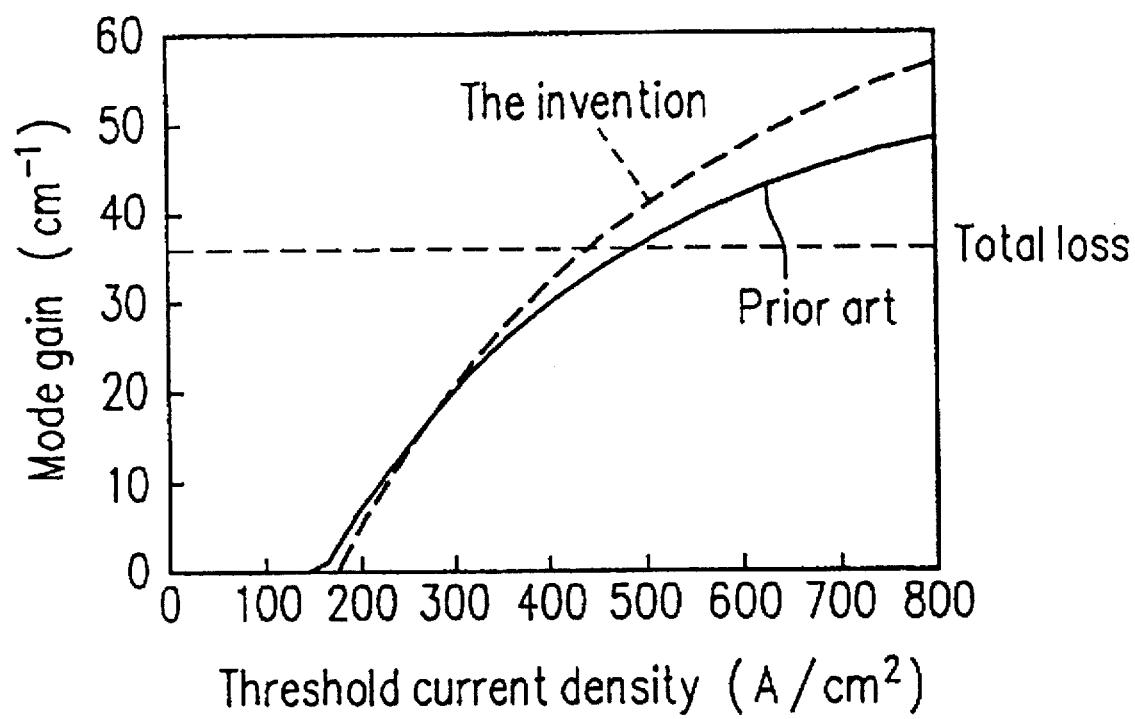
FIG. 12 is a graph showing the relationship between a threshold current density and a mode gain with respect to a semiconductor light-emitting device of the invention and a conventional semiconductor light-emitting device.

On the other hand, the optical and electrical characteristics of the light-emitting device are as follows. The oscillation wavelength is 500 nm. FIG. 12 shows the relationship between the density of the injected current and the mode gain in order to compare the light-emitting device of the invention with a conventional light-emitting device. For both of the light-emitting device of the invention and the conventional light-emitting device, the threshold current density is determined at the current density corresponding to the total loss of 35 cm$^{-1}$. The threshold current density of the light-emitting device of the invention is 440 Å/cm$^2$. That is, the threshold current density of the light-emitting device of the invention is reduced by 13% as compared with that of the conventional light-emitting device. These characteristics of the light-emitting device of the invention makes the lifetime of the semi-conductor light-emitting device much longer.

As described above, the use of a ZnCdSSe guiding layer provides us with a semiconductor light-emitting device having excellent characteristics. A $ZnS_{0.06}Se_{0.94}$ layer has conventionally been used as a guiding layer of a compound semiconductor light-emitting device of a ZnSe system. It has generally been considered difficult to obtain a uniform crystal having a well controlled composition ratio in the case where a ZnCdSSe quaternary mixed crystal is used by further adding Cd to the commonly used ZnSSe ternary mixed crystal. As proof of extreme difficulty in forming a guiding layer having satisfactory crystallinity, there was once a report of the success in oscillating a laser continuously at room temperature by the use of a guiding layer composed of a ternary mixed crystal such as $ZnS_{0.06}Se_{0.94}$. Moreover, even a skilled artisan did not think that it was preferable to increase a bend offset of the valence band by using a ZnCdSSe guiding layer in place of a $ZnS_{0.06}Se_{0.94}$ guiding layer. Under such circumstances, the present inventors recognized for the first time the advantage of providing a ZnCdSSe guiding layer for a light-emitting device, and then obtained a semiconductor light-emitting device shown in FIG. 8 by using a method for forming a mixed crystal having satisfactory crystallinity and a well controlled composition ratio.

With respect to the active layer or the guiding layer of the above-mentioned laser structure, the same effects may also be attained in the case where a superlattice such as $(ZnSe)_m (CdS)_n$ (m and n are integers) is employed in place of a mixed crystal such as $Zn_{0.8}Cd_{0.2}Se$ and $Zn_{0.9}Cd_{0.1}S_{0.19}Se_{0.81}$. $(ZnSe)_m(CdS)_n$ (m and n are integers) is a superlattice obtained by stacking a number m of ZnSe layers and a number n of CdS layers.

EXAMPLE 4

Figure 13:
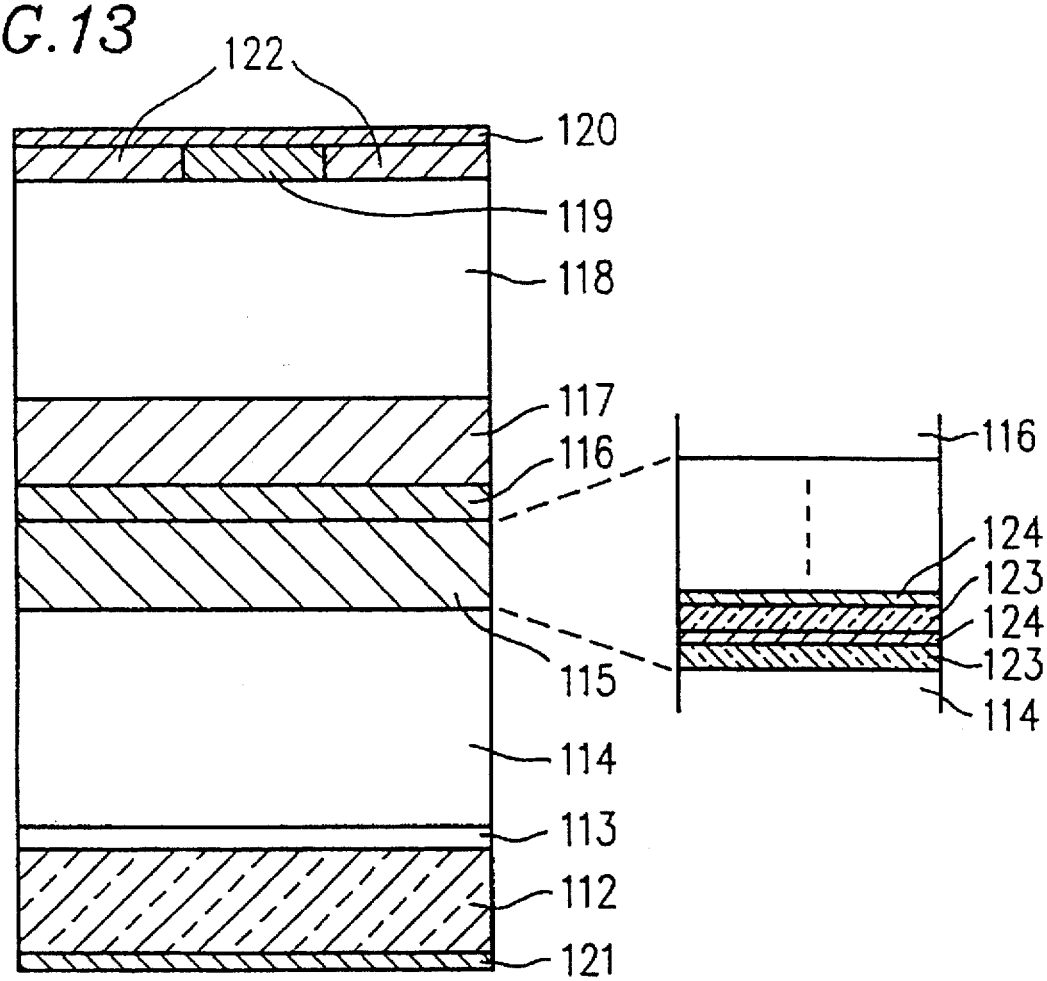
FIG. 13 is a cross-sectional view of a semiconductor light-emitting device according to a fourth example of the present invention.
Figure 14:
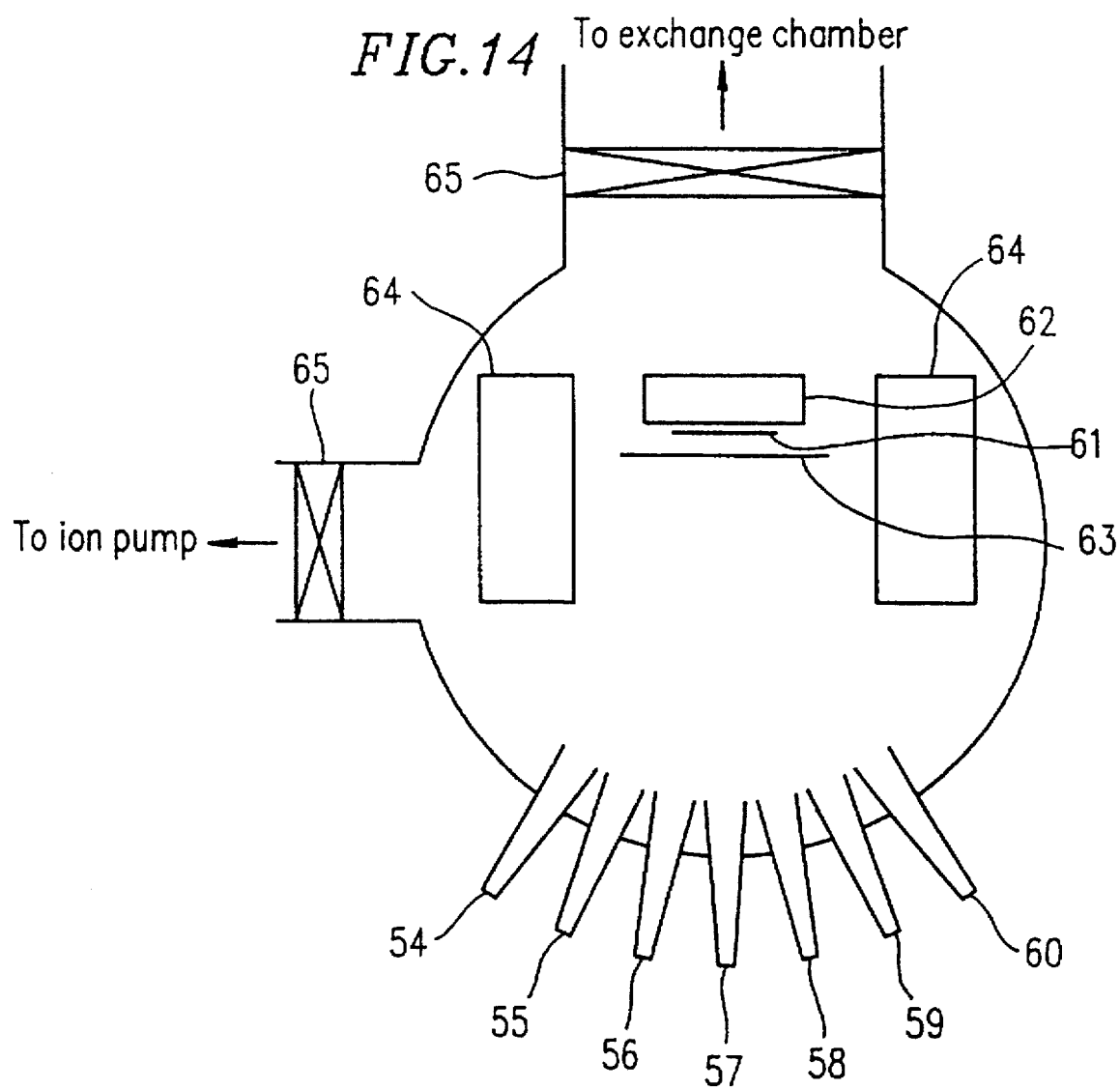
FIG. 14 is cross-sectional view of a molecular beam epitaxy system for producing the semiconductor light-emitting device shown in FIG. 13 and for implementing a crystal-growing method of the invention.

In this example of the present invention, a semiconductor light-emitting device shown in FIG. 13 is formed by using an MBE system shown in FIG. 14. The MBE system shown in FIG. 14 is different from the MBE system shown in FIG. 9 in that the MBE system of this example includes a smaller number of cells, i.e.¥, one Cd sell and one ZnS cell ere used in this example. The temperatures of the respective cells are controlled so that the beam flux ratios of the materials to be used may correspond to the respective layers to be formed, and that the growth rate may be 500 nm/h.

First, on an n-GaAs substrate 61 (denoted by 112 in FIG. 13) having (001) orientation subjected to a surface treatment, a chlorine-doped n-ZnSe layer 113 having a carrier density of $2 \times 10^{18}$ cm$^{-3}$ is grown by using the Zn cell 54, the Se cell 55, and the $ZnCl_2$ cell 59 so that the thickness of the layer 113 may be 100 Å. Immediately after the formation of the layer 113, a chlorine-doped n-$Zn_{0.83}Mg_{0.17}S_{0.2}Se_{0.8}$ cladding layer 114 having a carrier density of $2 \times 10^{18}$ cm$^{-3}$ and a film thickness of 1.0 µm is formed by using the Zn cell 54, the Mg cell 58, ZnS cell 57, the Se cell 55, and the $ZnCl_2$ cell 59.

Next, a guiding layer 115 constituted by a $Zn_{0.8}Cd_{0.2}Se/ZnS_{0.2}Se_{0.8}$ superlattice having a film thickness of 700 Å is formed. Subsequently, on an n-$Zn_{0.83}Mg_{0.17}S_{0.2}Se_{0.8}$ cladding layer 114, a $ZnS_{0.2}Se_{0.8}$ 5 atomic layer 123 is grown by using the Zn cell 54, the ZnS cell 57, and the Se cell 55.

Next, a $Zn_{0.8}Cd_{0.2}Se$ 2 atomic layer 124 is grown by using the Zn cell 54, the Cd cell 56, and the ZnS cell 57. On the atomic layer 124, a $ZnS_{0.2}Se_{0.8}$ 5 atomic layer 123 and a $Zn_{0.8}Cd_{0.2}Se$ 2 atomic layer 124 are grown. A $((Zn_{0.8}Cd_{0.2}Se)_2 (ZnS_{0.2}Se_{0.8})_5)_{20}$ superlattice guiding layer 115 is formed by repeating the crystal growth of the $ZnS_{0.2}Se_{0.8}$ 5 atomic layer 123 and a $Zn_{0.8}Cd_{0.2}Se$ 2 atomic layer 124 twenty times.

Immediately after that (without the suspension of the growth), an undoped $Zn_{0.8}Cd_{0.2}Se$ active layer 116 having a film thickness of 60 Å is formed by using the Zn cell 54, the Cd cell 56, and the Se cell 55. On the active layer 116, a $((Zn_{0.8}Cd_{0.2}Se)_2 (ZnS_{0.2}Se_{0.8})_5)_{20}$ superlattice guiding layer 117 having a film thickness of 700 Å is formed by using the Zn cell 54, the Cd cell 56, the ZnS cell 57, and the Se cell 55.

Thereafter, a nitrogen-doped p-$Zn_{0.83}Mg_{0.17}S_{0.2}Se_{0.8}$ cladding layer 118 having a carrier density of $2 \times 10^{17}$ cm$^{-3}$ and a film thickness of 1.0 µm is formed by using the Zn cell 54, the Mg cell 58, the ZnS cell 57, the Se cell 55, and the active nitrogen cell 60.

Finally, a nitrogen-doped p-ZnSe contact layer 119 having a carrier density of $8 \times 10^{17}$ cm$^{-3}$ and a film thickness of 100 Å is grown by using the Zn cell 54, the Se cell 55, and the active nitrogen cell 60, thereby completing a double heterostructure.

After the substrate on which the above-described semiconductor multi-layered structure has been formed is taken out of the growth chamber, a mask layer having a stripe width of 3 µm is formed in the same manner as in Example 3. Thereafter, an $SiO_2$ insulating film 122 having a thickness of 1000 Å is formed on the region of the substrate excluding the region where the mask layer is formed. A p type electrode 121 is placed thereon, and an n type electrode 122 is placed on the back surface of the GaAs substrate, thereby fabricating a light-emitting device substrate whose cross section is shown in FIG. 13. After that, the substrate is cleaved so cavity length may be 0.5 mm, and a Fabry-Perrot resonator is provided therein so as to complete a laser. Both end faces of the cleaved substrate are uncoated, and the reflectance thereof is 25%. An internal loss is the same value of 7.8 cm$^{-1}$ as that of Example 3, a cavity loss is 27.2 cm$^{-1}$, and a total loss is 35 cm$^{-1}$.

A $((Zn_{0.8}Cd_{0.2}Se)_2 (ZnS_{0.2}Se_{0.8})_5)_{20}$ superlattice gives an equivalent band offset as that of $Zn_{0.94}Cd_{0.06}S_{0.14}Se_{0.86}$ (see Z. Peng et al.; Jpn. J. Appl. Phys. 31 (1992) L1583). FIG. 10B shows the measurement result of the band offsets of the conduction band and the valence band between the adjacent two layers of the above-described laser structure based on a common anion rule and a common cation rule. As is apparent from the comparison with the laser structure shown in FIG.10A, the band offset of the valence band of the above-mentioned laser structure is 108 meV, i.e., a larger value than that of a conventional laser structure.

Various characteristics of the light-emitting device produced in the above-mentioned manner are as follows. The band gaps of the $Zn_{0.83}Mg_{0.17}S_{0.2}Se_{0.8}$ cladding layer, a $((Zn_{0.8}Cd_{0.2}Se)_2 (ZnS_{0.2}Se_{0.8})_5)_{20}$ superlattice guiding layer, and the $Zn_{0.8}Cd_{0.2}Se$ active layer are 2.92 eV, 2.72 eV, and 2.46 eV, respectively. With respect to the crystallinity, both the $Zn_{0.83}Mg_{0.17}S_{0.2}Se_{0.8}$ cladding layer and the $((Zn_{0.8}Cd_{0.2}Se)_2 (ZnS_{0.2}Se_{0.8})_5)_{20}$ superlattice guiding layer are lattice-matched with the GaAs substrate, and the half-width of the looking curve of an X-ray in the epitaxial layer is 45 sec. Accordingly, the light-emitting device of the invention exhibits almost the same crystallinity as that of a conventional light-emitting device using a $ZnS_{0.07}Se_{0.93}$ guiding layer.

Figure 15:
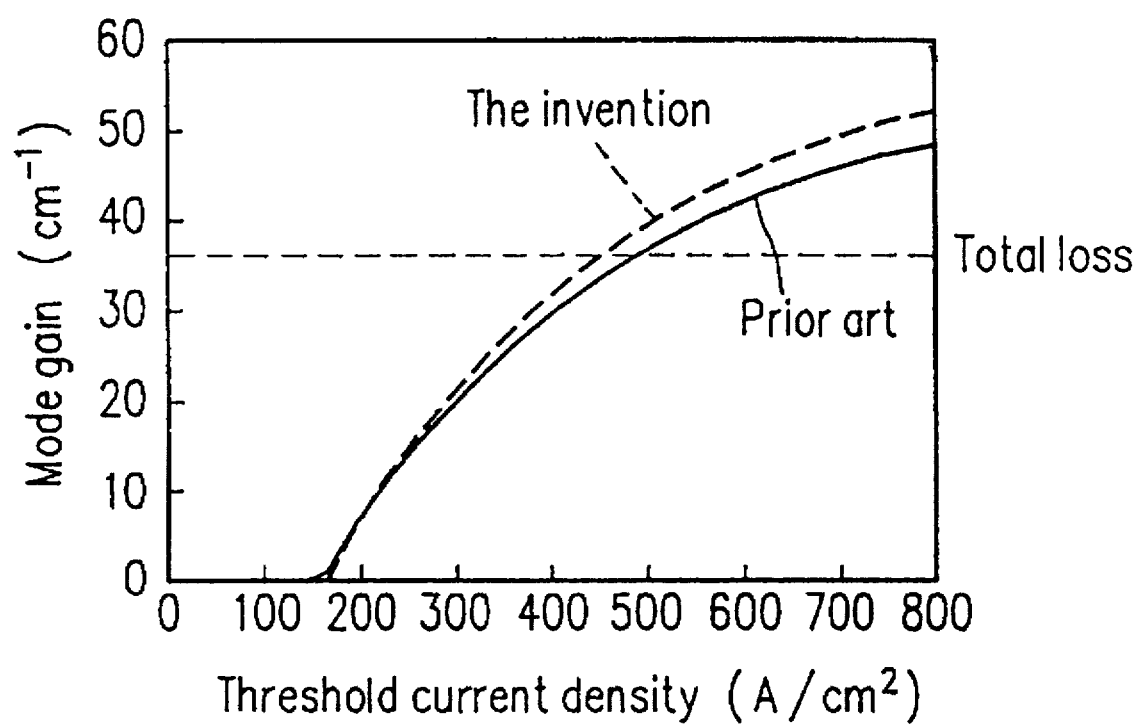
FIG. 15 is a graph showing the relationship between a threshold current density and a mode gain with respect to the semiconductor light-emitting device shown in FIG. 13 and a conventional semiconductor light-emitting device.

On the other hand, the optical and electrical characteristics of the light-emitting device are as follows. The oscillation wavelength is 504 nm. FIG. 15 shows the relationship between the density of the injected current and the mode gain in order to compare the light-emitting device of the invention with a conventional light-emitting device. For both of the light-emitting device of the invention and the conventional light-emitting device, the threshold current density is the same as that of Example 3, i.e., the density is determined at the current density corresponding to the total loss of 35 cm$^{-1}$. The threshold current density of the light-emitting device of the invention is 460 A/cm$^2$. That is, the threshold current density of the light-emitting device of the invention is reduced by 7% as compared with that of the conventional light-emitting device. The resistibility of the element of the invention is 0.7Ω, which value is lower than that of a conventional element by 30%. This is because the element of the invention is not affected by the degradation of the interface caused by suspension of growth. These features of the light-emitting device of the invention makes the lifetime of the semiconductor light-emitting device much longer.

EXAMPLE 5

Figure 16:
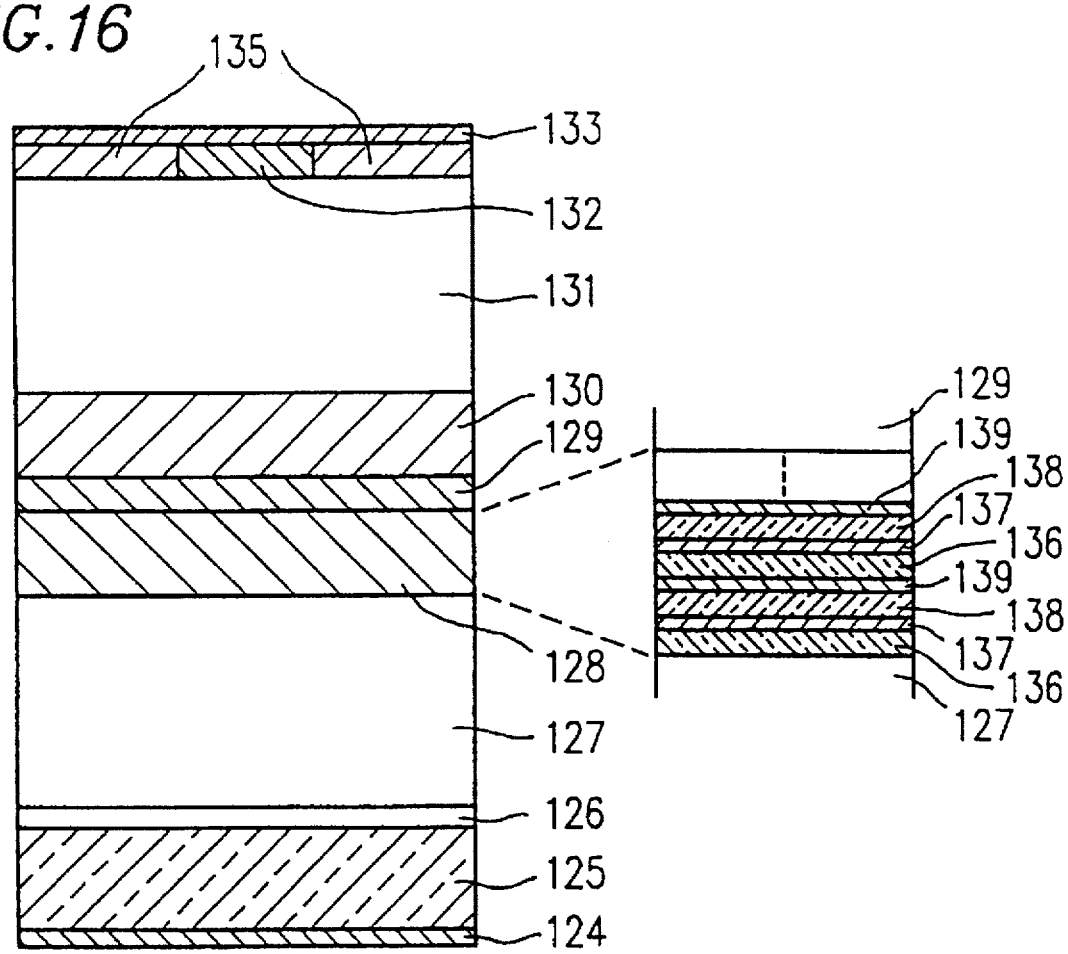
FIG. 16 is a cross-sectional view of a semi-conductor light-emitting device according to a fifth example of the present invention.
Figure 17:
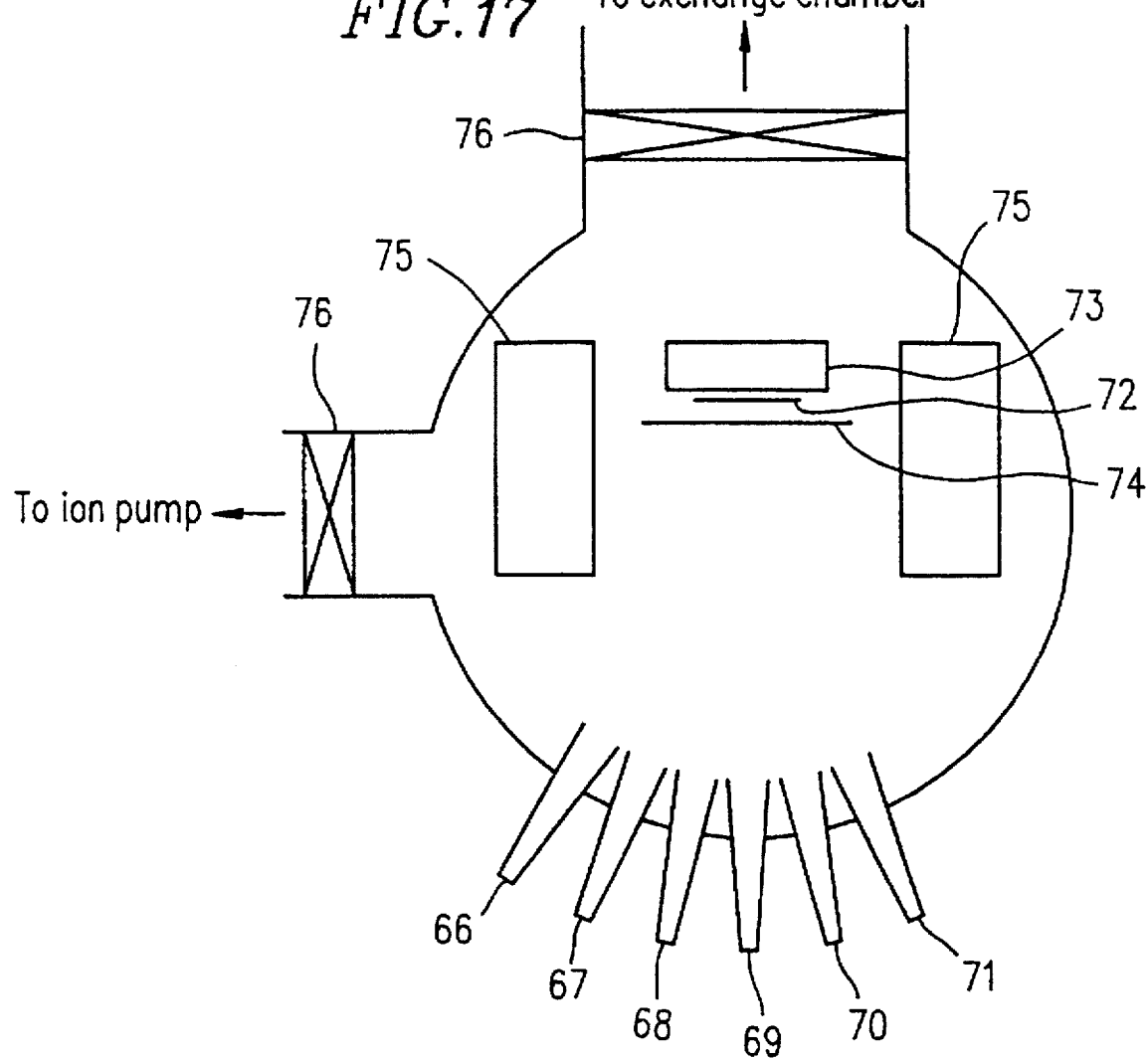
FIG. 17 is cross-sectional view of a molecular beam epitaxy system for producing the semiconductor light-emitting device shown in FIG. 16 and for implementing a crystal-growing method of the invention.

In this example of the present invention, a semiconductor light-emitting device shown in FIG. 16 is formed by using an MBE system shown in FIG. 17. The MBE system shown in FIG. 17 is different from the MBE system shown in FIG. 14 in that the MBE system of this example employs II-VI compounds such as ZnSe and CdSe as the materials. The temperatures of the respective cells are controlled so that the beam flux ratios of the materials to be used may correspond to the respective layers to be formed, and that the growth rate may be 500 nm/h.

First, on an n-GaAs (001) substrate 125 subjected to a surface treatment, a chlorine-doped n-ZnSe layer 126 having a carrier density of 2×10$^{18}$ cm$^{-3}$ is grown by using the Zn cell 66 and the ZnCl$_2$ cell 70 so that the thickness of the layer 126 may be 100 Å. Immediately after the formation of the layer 126, a chlorine-doped n-Zn$_{0.83}$Mg$_{0.17}$S$_{0.2}$Se$_{0.8}$ cladding layer 127 having a carrier density of 2×10$^{18}$ cm$^{-3}$ and a film thickness of 100 Å is formed by using the Zn cell 66, the MgSe cell 69, the ZnS cell 68, the CdSe cell 67, and the ZnCl$_2$ cell 70.

Next, a guiding layer 128 constituted by a ZnSe/CdSe/ZnS superlattice having a film thickness of 700 Å is formed. Specifically, on the n-Zn$_{0.83}$Mg$_{0.17}$S$_{0.2}$Se$_{0.8}$ cladding layer 127, a ZnSe 5 atomic layer 136 using the ZnS cell 66. Next, a CdSe 2 atomic layer 137 is grown by using the CdSe cell 67. On the atomic layer 137, a ZnSe 5 atomic layer 138 is grown by using the ZnS cell 66 again and a ZnS 4 atomic layer 139 is grown by using the ZnS cell 68. A ((ZnSe)$_{10}$ (CdSe)$_2$ (ZnS)$_4$)$_9$ superlattice guiding layer 128 is formed by repeating the crystal growth of the ZnSe 5 atomic layer 136, the CdSe 2 atomic layer 137, the ZnSe 5 atomic layer 138, and the ZnS 4 atomic layer 139 nine times.

Immediately after that (without the suspension of the growth), an undoped Zn$_{0.8}$Cd$_{0.2}$Se active layer 129 having a film thickness of 60 Å is formed by using the ZnSe cell 66 and the CdSe cell 67. On the active layer 129, the ((ZnSe)$_{10}$ (CdSe)$_2$ (ZnS)$_4$)$_9$ superlattice guiding layer 130 having a thickness of 700 Å is formed by using the ZnSe cell 66, the CdSe cell 67, and ZnS cell 68. Thereafter, a nitrogen-doped p-Zn$_{0.83}$Mg$_{0.17}$S$_{0.2}$Se$_{0.8}$ cladding layer 131 having a carrier density of 2×10$^{17}$ cm$^{-3}$ and a film thickness of 1.0 μm is formed by using the ZnSe cell 66, the MgSe cell 69, the ZnS cell 68, and the active nitrogen cell 71. Finally, a nitrogen-doped p-ZnSe contact later 132 having a carrier density of 8×10$^{17}$ cm$^{-3}$ and a film thickness of 100 Å is grown by using the ZnSe cell 66, and the active nitrogen cell 71, thereby completing a double heterostructure consisting of the respective layers 126 to 132.

After the substrate on which the above-described semiconductor multi-layered structure has been formed is taken of from the growth chamber, a mask layer having a stripe width of 3 μm is formed in the same manner as in Example 3. Thereafter, an SiO$_2$ insulating film 135 having a thickness of 1000 Å is formed on the region of the substrate excluding the region where the mask layer is formed. A p type electrode 133 is placed thereon, and an n type electrode 134 is placed on the back surface of the GaAs substrate, thereby fabricating a light-emitting device substrate whose cross section is shown in FIG. 16. After that, the substrate is cleaved so that the cavity length may be 0.5 mm, and a Fabry-Perrot resonator is provided therein so as to complete a laser. Both end faces of the cleaved substrate are uncoated, and the reflectance thereof is 25%. An internal loss is the same value of 7.8 cm$^{-1}$ as that of Example 3, a cavity loss is 27.2 cm$^{-1}$, and a total loss is 35 cm$^{-1}$.

Figure 10D:
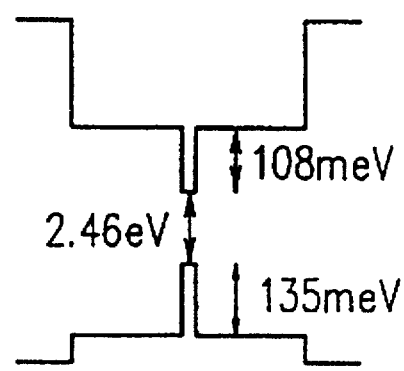

A ((ZnSe)$_{10}$ (CdSe)$_2$ (ZnS)$_4$)$_9$ superlattice gives an equivalent band offset as that of Zn$_{0.9}$Cd$_{0.1}$S$_{0.2}$Se$_{0.8}$ (see Z. Pang et al.; Jpn. J. Appl. Phys. 31 (1992) L1583). FIG. 10D shows the measurement result of the band offsets of the conduction band and the valence band between the adjacent two layers of the above-described laser structure based on a common anion rule and a common cation rule. As is apparent from the comparison with the conventional laser structure shown in FIG. 10A, the band offset of the valence band of the above-mentioned laser structure is 135 meV, i.e. a larger value than that of a conventional laser structure.

Various characteristics of the light-emitting device produced in the above-mentioned manner are as follows. The band gaps of the Zn$_{0.83}$Mg$_{0.17}$S$_{0.2}$Se$_{0.8}$ cladding layer, a ((ZnSe)$_{10}$ (CdSe)$_2$ (ZnS)$_4$)$_9$ superlattice guiding layer, and the Zn$_{0.8}$Cd$_{0.2}$Se active layer are 2.92 eV, 2.72 eV, and 2.46 eV, respectively. With respect to the crystallinity, both the Zn$_{0.83}$Mg$_{0.17}$S$_{0.2}$Se$_{0.8}$ cladding layer and the ((ZnSe)$_{10}$ (CdSe)$_2$ (ZnS)$_4$)$_9$ superlattice guiding layer are lattice-matched with the GaAs substrate, and the half-width of the locking curve of an X-ray in the epitaxial layer is 40 sec. Accordingly, the light-emitting device of the invention exhibits almost the same crystallinity as that of a conventional light-emitting device using a ZnS$_{0.07}$Se$_{0.93}$ guiding layer. The oscillation wavelength of the light-emitting device is 504 nm.

Figure 18:
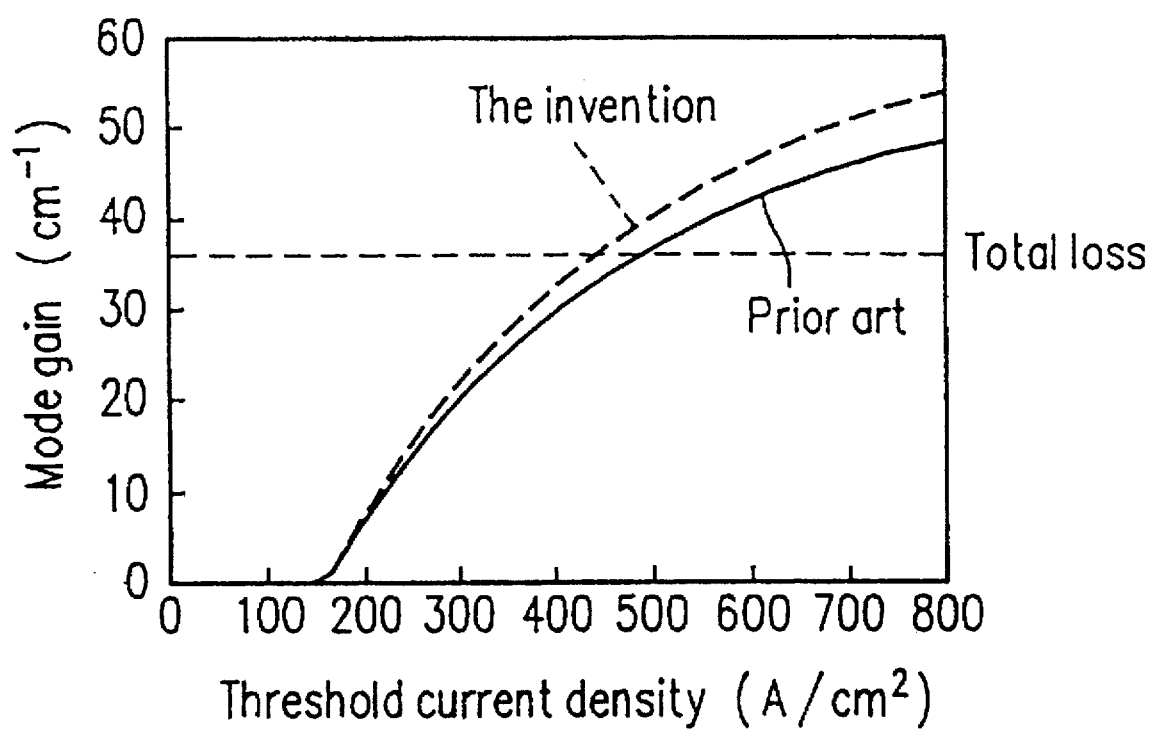
FIG. 18 is a graph showing the relationship between a threshold current density and a mode gain with respect to the semiconductor light-emitting device shown in FIG. 16 and a conventional semiconductor light-emitting device.

FIG. 18 shows the relationship between the density of the injected current and the mode gain in order to compare the light-emitting device of the invention with a conventional light-emitting device. For both of the light-emitting device of the invention and the conventional light-emitting device, the threshold current density is the same as that of Example 3, i.e., the density is determined at the current density corresponding to the total loss of 35 cm$^{-1}$. The threshold current density of the light-emitting device of the invention is 440 A/cm$^2$. That is, the threshold current density of the light-emitting device of the invention is reduced by 13% as compared with that of the conventional light-emitting device. These features of the light-emitting device of the invention makes the lifetime of the semiconductor light-emitting device much longer.

In the above described Examples 3 to 5, the Zn$_{0.8}$Cd$_{0.2}$Se layer is used as the active layer. Alternatively, the active layer may be constituted by (Zn$_{1-x}$Cd$_x$S$_y$Se$_{1-y}$)$_m$ (Zn$_{1-z}$Cd$_z$S$_t$Se$_{1-t}$)$_n$, where 0≤x≤1, 0≤y≤1, 0≤z≤1, 0≤t≤1, a<(xm+yn)/(m+n),(zm+tn)/(m+n)<b, and m and n are integers.

Thus, the invention described herein makes possible the advantages of (1) providing a highly reliable semiconductor light-emitting device having a lower threshold current density and much longer lifetime as compared with a conventional light-emitting device by employing a ZnCdSSe guiding layer; and (2) eliminating the suspension of the epitaxial growth by constituting a guiding layer with a $(Zn_{1-x}Cd_xSe)_m$ $(ZnS_ySe_{1-y})_n$ containing $Zn_{1-x}Cd_xSe$ constituting the active layer by the use of a single cell for a Cd element or a compound containing Cd, or by the use of a single cell for an elemental S or a compound containing S, while maintaining the molecular beam intensity at the same value; or by constituting a guiding layer with $(ZnSe)_m (CdSe)_n (ZnS)_l$ by the use of II-VI compounds, thereby producing a semiconductor light-emitting device having a low resistibility and satisfactory crystallinity.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light-emitting device comprising a GaAs substrate and a II-VI compound semiconductor multi-layered structure formed on the GaAs substrate, wherein the semiconductor multi-layered structure comprises a $Zn_{1-x}Cd_xS_ySe_{1-y}$ ($0<x\leq1$ and $0\leq y\leq1$) active layer and a pair of $Zn_{1-x'}Cd_{x'}S_{y'}Se_{1-y'}$ ($0<x'\leq1$ and $0\leq y'\leq1$) guiding layers interposing the active layer;

a mole fraction (x) of Cd in the active layer is larger than a mole fraction (x') of Cd in the guiding layers; a mole fraction (y) of S in the active layer is smaller than a mole fraction (y') of S in the guiding layers;

a type I hetero junction is formed between the active layer and the guiding layers; and between the active layer and the guiding layers, a band offset of a valence band $\Delta Ev$ and an entire band offset $\Delta Eg$ satisfies a relationship of $\Delta Ev/\Delta Eg>0.32$.

2. A semiconductor light-emitting device according to claim 1, wherein the multi-layered structure comprises a pair of II-VI compound semiconductor cladding layers interposing The active layer and the pair of guiding layers; and the active layer, the pair of guiding layers and the pair of cladding layers form a separate-confinement heterostructure.

3. A semiconductor light-emitting device according to claim 1, wherein at least one of the active layer and the guiding layers has a superlattice structure.

4. A semiconductor light-emitting device according to claim 3, wherein the active layer is formed by a $Zn_{1-x}Cd_xSe$ layer, and at least one of the pair of guiding layers is formed by a superlattice layer comprising a $Zn_{1-x}Cd_xSe$ layer.

5. A semiconductor light-emitting device according to claim 3, wherein the superlattice structure is a $(Zn_{1-x}Cd_xSe)_m$ $(ZnS_{y'}Se_{1-y'})_n$ superlattice layer ($0<y'\leq1$ and where m and n are integers).

6. A semiconductor light-emitting device according to claim 3, wherein at least one of the guiding layers is formed by a $(Zn_{1-a}Cd_aS_bSe_{1-b})_m$ $(Zn_{1-c}Cd_cSe_{1-d})_n$ superlattice ($0<a\leq1$, $0<b\leq1$, $0<c\leq1$, $0<d\leq1$, where m and n are integers).

7. A semiconductor light-emitting device according to claim 1, wherein at least one of the pair of guiding layers is formed by a superlattice layer, the superlattice layer comprising a ZnSe layer, a CdSe layer and a ZnS layer.

8. A semiconductor light-emitting device according to claim 7, wherein the superlattice layer is a $(ZnSe)_m (CdSe)_n (ZnS)_l$ superlattice layer (where m, n and l are integers).

9. A semiconductor light-emitting device comprising a GaAs substrate and a II-VI compound semiconductor multi-layered structure formed on the GaAs substrate, wherein the semiconductor multi-layered structure comprises a $Zn_{1-x}Cd_xSe_{1-y}S_y$ ($0<x<0.5$ and $0<y<0.5$) active layer and a pair of $Zn_{1-x'}Cd_{x'}S_{y'}Se_{1-y'}$ ($0<x'<0.5$ and $0<y'<0.5$) guiding layers interposing the active layer;

a mole fraction of Cd (x) in the active layer is larger than a mole fraction of Cd (x') in the guiding layers; a mole fraction of S (y) in the active layer is smaller than a mole fraction of S (y') in the guiding layers;

a type I hetero junction is formed between the active layer and the guiding layers; and between the active layer and the guiding layers, a band offset of a valence band $\Delta Ev$ and an entire band offset $\Delta Eg$ satisfies a relationship of $\Delta Ev/\Delta Eg>0.32$.

10. A semiconductor light-emitting device comprising a GaAs substrate and a II-VI compound semiconductor multi-layered structure formed on the GaAs substrate, wherein the semiconductor multi-layered structure comprises a pair of guiding layers interposing an active layer, at least one of the guiding layers being formed by a $(Zn_{1-x}Cd_xSe)_m(ZnS_ySe_{1-y})_n$ superlattice (where m and n are integers); the active layer is formed of $Zn_{1-u}Cd_uS_vSe_{1-v}$ (where $0<u<1$, $0<v<1$, $x<u$ and $y>v$);

a type I hetero junction is formed between the active layer and the guiding layers; and between the active layer and the guiding layers, a band offset of a valence band $\Delta Ev$ and an entire band offset $\Delta Eg$ satisfies a relationship of $\Delta Ev/\Delta Eg>0.32$.

* * * * *